(12) United States Patent
Ishiguro et al.

(10) Patent No.: US 7,592,606 B2
(45) Date of Patent: Sep. 22, 2009

(54) MANUFACTURING EQUIPMENT USING ION BEAM OR ELECTRON BEAM

(75) Inventors: Koji Ishiguro, Hitachinaka (JP); Kaoru Umemura, Tokyo (JP); Noriyuki Kaneoka, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 153 days.

(21) Appl. No.: 11/779,686

(22) Filed: Jul. 18, 2007

(65) Prior Publication Data

US 2008/0018460 A1 Jan. 24, 2008

(30) Foreign Application Priority Data

Jul. 19, 2006 (JP) ............................ 2006-197218

(51) Int. Cl.
*G08B 21/00* (2006.01)
(52) U.S. Cl. .................. 250/442.11; 250/311; 250/307; 250/306; 250/492.21; 250/492.1
(58) Field of Classification Search ................. 250/306, 250/307, 309, 310, 440.11, 492.21, 311, 250/442.11, 492.2, 492.1
See application file for complete search history.

(56) References Cited

U.S. PATENT DOCUMENTS

| | | | | |
|---|---|---|---|---|
| 4,933,565 A | * | 6/1990 | Yamaguchi et al. | 250/492.2 |
| 5,063,294 A | * | 11/1991 | Kawata et al. | 250/309 |
| 6,417,512 B1 | * | 7/2002 | Suzuki | 250/307 |
| 6,717,156 B2 | * | 4/2004 | Sugaya et al. | 250/440.11 |
| 6,963,068 B2 | * | 11/2005 | Asselbergs et al. | 250/311 |
| 7,326,942 B2 | * | 2/2008 | Shichi et al. | 250/492.21 |
| 2004/0089821 A1 | * | 5/2004 | Shichi et al. | 250/492.21 |
| 2004/0256555 A1 | * | 12/2004 | Shichi et al. | 250/307 |
| 2005/0001164 A1 | * | 1/2005 | Tokuda et al. | 250/309 |
| 2005/0178980 A1 | * | 8/2005 | Skidmore et al. | 250/492.21 |
| 2007/0158560 A1 | * | 7/2007 | Kaneoka et al. | 250/309 |
| 2008/0042057 A1 | * | 2/2008 | Sanada et al. | 250/305 |

FOREIGN PATENT DOCUMENTS

JP 3564717 B2 6/2004

* cited by examiner

*Primary Examiner*—David A Vanore
*Assistant Examiner*—Michael J Logie
(74) *Attorney, Agent, or Firm*—Crowell & Moring LLP

(57) ABSTRACT

Provided is a charged particle beam processing apparatus capable of improving yields by suppressing the spread of metal pollution to a semiconductor manufacturing process to a minimum. The charged particle beam processing apparatus includes an ion beam column 1 that is connected to a vacuum vessel 10 and irradiates a sample 35 with an ion beam 11 of nonmetal ion species, a microsampling unit 3 having a probe 16 that extracts a microsample 43 cut out from a sample 35 by the ion beam 11, a gas gun 2 that discharges a gas for bonding the microsample 43 and the probe 16, a pollution measuring beam column 6A that is connected to the same vacuum vessel 10 to which the ion beam column 1 is connected and irradiates an ion beam irradiation traces by the ion beam column 1 with a pollution measuring beam 13, and a detector 7 that detects characteristic X-rays emitted from the ion beam irradiation traces by the ion beam column 1 upon irradiation with the pollution measuring beam 13.

22 Claims, 13 Drawing Sheets

WEIGHT COMPONENT RATIO Wt (%)

NORMAL VALUE

WEIGHT COMPONENT RATIO Wt (%)

OCCURRENCE OF POLLUTION

MANUFACTURING EQUIPMENT USING ION BEAM OR ELECTRON BEAM

BACKGROUND OF THE INVENTION

1. Field of the Invention

The present invention relates to a manufacturing equipment using ion beam or electron beam that processes samples by use of ion beams.

2. Background Art

In recent years, attention has been focused on inspection and analysis techniques for reducing the manufacturing costs of semiconductor devices represented by microprocessors, semiconductor memories represented by dynamic random-access memories, electronic parts such as magnetic heads and the like. Optimizing process conditions and making failure analyses and the like efficient by putting inspection and analysis techniques to full use to contribute to the shortening of development periods and early improvements in yield.

Examples of inspection and analysis apparatus include a dual beam FIB-SEM system in which a focused ion beam (hereinafter abbreviated as "FIB") device and a scanning electron microscope (hereinafter abbreviated as "SEM") are combined. An FIB-SEM system has the function of irradiating a sample with FIBs and forming a section in the sample by the sputtering action, and it is possible to observe the section of a defective portion under a SEM. However, a SEM having a resolution on the order of several nanometers has already been insufficient for observing the construction of leading-edge devices for which miniaturization is moving forward. Therefore, a technique has come to be used which involves cutting out a defect-including microsample having a side on the order of 10 μm from a sample by using FIBs and a probe without cutting off the sample, taking out the microsample to outside the apparatus, and observing the microsample under a scanning transmission electron microscope (hereinafter abbreviated as "STEM") or a transmission electron microscope (hereinafter abbreviated as "TEM"), both having a subnanometer-level resolution.

In a general FIB device, a gallium (GA) ion source is used, and gallium remains around a processed hole after the picking-out of a microsample. It is very probable that the remaining gallium will cause a defect in the following semiconductor manufacturing process. Particularly, the remaining gallium becomes a P-type impurity for a silicon semiconductor. Therefore, if an FIB-treated wafer is returned to the line as it is, the gallium diffuses and there is a high possibility that this induces deterioration in mechanical properties. For this reason, it is impossible to return a wafer from which a microsample has been picked out by using FIBs again to the production line and hence such wafers has to be discarded. Because recently the diameter of wafers has become larger and the number of processes has been increasing, the damage by the discarding of such wafers has amounted to a great amount of money.

Against this background, there has been available a method that involves using, as ion species for sample processing, ions of inactive gases of argon, krypton, xenon, etc., nitrogen gas, oxygen gas and the like in place of gallium as a technique for preventing gallium pollution (refer to JP Patent No. 3564717, for example). In this method, a microwave plasma, which is a nonpolar discharge, is used in an ion generation source and extracted, an ion beam of a target ion species is extracted by use of an electrode and an accelerating electrode, and the section of a sample processed by the extracted ion beam is observed under a SEM.

However, in the above-described conventional technique, a nonmetallic gas ion beam is used as a processing ion beam and metal pollution sometimes occurs when a sample is processed mainly during a malfunction of an FIB-SEM system. For example, this is a case where a power supply control system is stopped to protect the power supply in association with a short-circuit discharge that frequently occurs immediately after the maintenance of an ion generation source.

For example, when the applied voltage of a condenser lens changes from a normal value to zero, with the processing beam extracted, the beam diameter becomes large compared to a normal operating condition, and portions not irradiated with the beam in a normal operating condition (the electrode, inner wall of the column and the like) are irradiated with the beam, with the result that if the irradiated portion is made of metal, a material sputtered with the ion beam reaches the sample, causing metal pollution. Similarly, when the applied voltage and acceleration voltage for extracting the processing beam change from normal values to zero, the beam divergence angle changes and portions not irradiated with the beam in a normal operating condition are sometimes irradiated with the beam.

When the extraction accuracy of a beam of a target ion species decreases, a sample becomes irradiated with a metal ion beam that should be essentially removed under normal circumstances and pollution occurred. Usually, an ion beam apparatus has a mass separator or the like in order to take out only a necessary nonmetallic ion beam from many kinds of ions including metallic ions generated by an ion generation source. When the applied voltage of an electrode of a mass separator (the current value of a coil when the coil is used for magnetic field generation) drops gradually due to discharge and the like, with the processing beam extracted, then in the process of a decrease in this voltage (or current) the sample is irradiated with beams other than an ion beam that should be essentially be used. Metal pollution occurs if a metallic ion beam is included in these unintended ion beams.

In order to ensure that neutron particles including metallic particles generated in an ion generation source do not reach the sample as they are, usually, the ion beam orbit from the ion generation source to the sample is bent and not straight. Therefore, a defector that deflects the traveling direction of ion beams toward the sample is used in an ion beam apparatus. In general, a deflector that deflects ion beams by an electric field is used.

Also in this case as described above, if the applied voltage of an electrode of a deflector drops gradually due to discharge and the like, with the ion beam extracted, then the ion beam deflects from the target orbit, with the result that metal pollution occurs if a metal portion becomes irradiated with the ion beam.

A sputtered metal material remaining within a processing optical system, which is generated by irradiation with an unintended ion beam like this, reaches the sample by the transport effect associated with the static electric force of the processing ion beam immediately after restoration of the apparatus following taking discharge-related measures, and this may sometimes cause pollution.

Such irregularities occur also when the power supply control system of an ion beam apparatus is stopped due to an electric power failure and the like. Also, metal pollution occurs similarly when the operator makes mistakes in setting beam conditions when changing the processing beam species and the beam irradiation conditions.

The object of the present invention is to provide a charged particle beam processing apparatus capable of improving yields by suppressing the spread of metal pollution to a semiconductor manufacturing process to a minimum extent.

SUMMARY OF THE INVENTION

To achieve the above object, in the present invention, immediately after the startup of the apparatus performed following a discharge within the apparatus and a power failure, the level of contamination by ion beams is measured, within a vacuum vessel that processes a sample, before sample processing after unsteady operations, such as changing of beam irradiation conditions. When contamination exceeding a given value has been recognized, for example, an alarm is displayed to urge the operator to take pollution control measures by suspending the processing.

DETAILED DESCRIPTION OF THE PREFERRED EMBODIMENTS

Embodiments of the present invention will be described below with reference to the accompanying drawings.

<General Construction>

Figure 1:
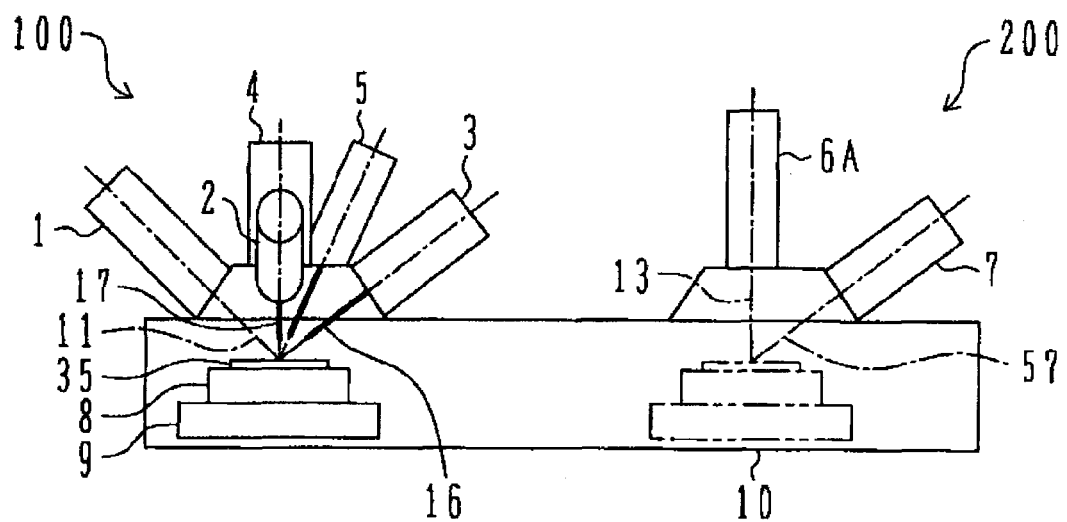
FIG. 1 is a schematic block diagram showing an example of the construction of a charged particle beam processing apparatus related to an embodiment of the present invention.

FIG. 1 is a schematic block diagram showing an example of the construction of a charged particle beam processing apparatus related to an embodiment of the present invention.

The charged particle beam processing apparatus of the embodiment (hereinafter described as this apparatus) comprises a first unit 100 having the function of processing a sample 35, a second unit 200 having the function of measuring the metal pollution caused by an ion beam 11 for sample processing of the first unit 100, a sample holder that holds the sample 35, a stage 9 that moves the sample holder 8, and a vacuum vessel 10 that encloses the sample holder 8 and the stage 9. The units 100 and 200 are attached to the vacuum vessel 10, and the stage 9 moves within the vacuum vessel 10 and transfers the sample 35 to the position of a beam axis of each of the units 100, 200.

In this apparatus, the first unit 100 has an ion beam column 1 having the function of irradiating the sample 35 with the ion beam 11 and singly processing and observing the same point on the sample 35, a microsampling unit 3 that picks out, by use of a probe 16, a microsample 43 (see FIG. 6 and FIGS. 7(A) to 7(D), which will be described later), which has been cut out of the sample 35 by hole processing with the ion beam 11, a gas gun 12 that bonds the microsample 43 and the probe 16 by a gas that is caused to flow out of a gas nozzle 17, an observational electron beam column 4, and an electron beam gas gun 5.

Although this is not illustrated, the first unit 100 is provided with a secondary electron detector that detects secondary electrons emitted from a target object when the target object is irradiated with an electron beam from the electron beam column 4, and the electron beam column 4 constitutes a SEM (including a review SEM) along with the secondary electron detector. However, it is also conceivable that a transmission electron detector is provided that detects transmission electrons transmitted through a target object when the target object is irradiated with an electron beam from the electron beam column 4, and this transmission electron detector, along with the electron beam column 4, is provided as a STEN or a TEM.

On the other hand, the second unit 200 has a pollution measuring beam column (an electron beam column) 6A, which irradiates an inspection object with a pollution measuring beam (an electron beam) 13, and a detector 7 that detects a characteristic X-ray 57 peculiar to each element emitted from an inspection object when this inspection object is irradiated with a pollution measuring beam 13 from this pollution measuring beam column 6A. The pollution measuring beam column 6A is connected to the same vacuum vessel 10 to which the ion beam column 1 is connected. The pollution measuring beam column 6A may be replaced with an X-ray beam column that irradiates an inspection object with an X-ray beam as the pollution measuring beam 13.

Incidentally, although this is not illustrated, this apparatus is also provided with a power supply system, a controller that controls each unit, a central control unit that controls the whole of this apparatus, a console used to provide instructions for the operation of this apparatus by an interface screen displayed on a display unit (refer to a GUI screen 60 of FIG. 10) and other operation devices and the like, a vacuum evacuation system that evacuates the vacuum vessel 10 and the like.

Figure 2:
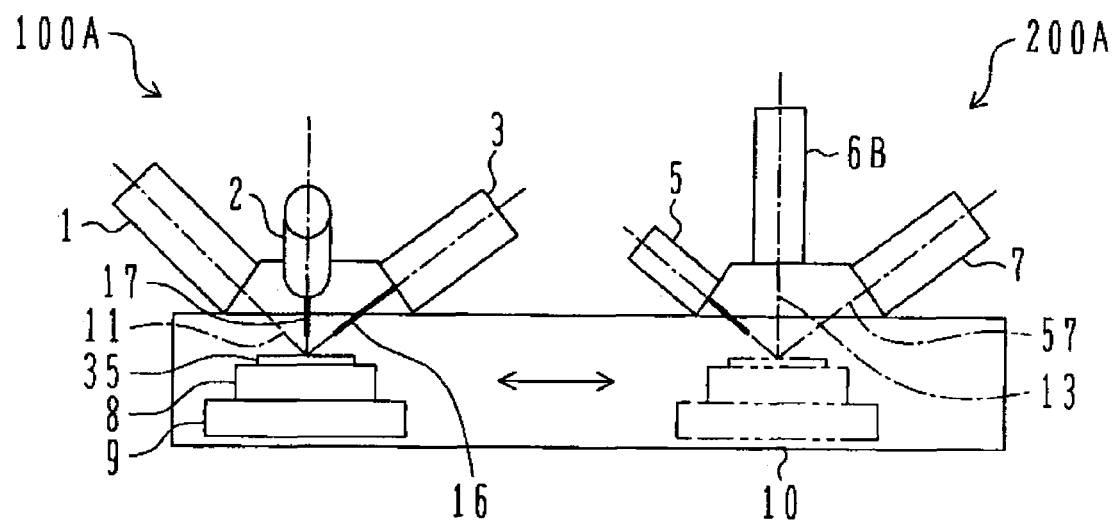
FIG. 2 is a schematic block diagram showing another example of the construction of a charged particle beam processing apparatus related to an embodiment of the present invention.

FIG. 2 is a schematic block diagram showing another example of the construction of this apparatus. Like reference characters refer to like parts of FIG. 1 and descriptions of such parts are omitted.

The example of the construction of FIG. 2 differs from the example of the construction of FIG. 1 in the point that the observational electron beam column 4 is integrated with the pollution measuring beam column 6A and a pollution measuring column 6B that serves also as an observational electron beam column is provided. In this example, a first unit 100A having the function of processing the sample 35 is provided with an ion beam column 1, a gas gun 2, a microsampling unit 3, and a second unit 200A having the function of pollution measurement has a pollution measuring beam column 6B, an electronic beam gas gun 5, and a detector 7.

When used for observational purposes, the electron beam conditions of the pollution measuring beam column 6B in this example are set, for example, at an accelerated voltage of electron beam of 5 kV maximum and a maximum value of electron beam current value on the order of several tens of picoamperes (the same applies to the electron beam column 4). When used in pollution measurement, the electron beam conditions of the pollution measuring beam column 6B in this example are set, for example, at a high acceleration on the order of 15 kV and a high current on the order of several hundreds of picoamperes in order to perform an element analysis (the same applies to the electron beam column 6A). When irradiation with high-acceleration and large-current electron beams for pollution measurement is performed, it is necessary to increase the distance between the pollution measuring beam column 6B and the sample 35 (working distance, hereinafter abbreviated as WD). Therefore, the stage 9 is provided with a mechanism that moves in the direction of the beam travel axis (the vertical direction in FIG. 2) of the pollution measuring beam 13 of the pollution measuring beam column 6B to ensure that when an object of pollution measurement is irradiated with the pollution measuring beam 13, the sample holder 8 can be made distant from the pollution measuring beam column 6B (can be caused to descend in FIG. 2).

The construction of FIG. 2 is superior to the construction of FIG. 1 in the point that because the number of each of the beam columns is small, the installation area of the beam columns is small and hence the cost is low. Furthermore, because the ion beam column 1 and the pollution measuring beam column 6B do not view the same point (the positions irradiated with beams are spaced from each other), it is possible to cause the ion beam column 1 and the pollution measuring beam column 6B to be sufficiently near to the sample 35 compared to the case of the ion beam column 1 and the electron beam column 4 of FIG. 1. That is, the distance (WD) between the beam columns and the sample 35 can be reduced compared to the construction of FIG. 1 and, therefore, the resolution is high.

In the case of the construction which is such that the ion beam column 1 and the electron beam column 4 view the same point as in FIG. 1, it is impossible to cause the ion beam column 1 and the electron beam column 4 to be sufficiently near in order to avoid mutual interference and the WD increases, with the result that the resolution tends to decrease. These days due to the lack of the resolution of an observational SEM in association with the tendency toward miniaturization in the design rule, the number of cases where a close observation of an internal structure and the observation of defects cannot be performed has been increasing. Accordingly, the construction shown in FIG. 2 is preferable to the construction of FIG. 1 in order to meet the recent requirements for high resolution designs of SEMs.

On the other hand, the construction of FIG. 1 is superior to the construction of FIG. 2 in the point that because the ion beam column 1 and the electron beam column 4 are constructed so as to view the same point (because the aiming positions of the beams coincide), it is possible to observe the processing condition by the electron beam column 4 while performing the processing of the sample 35 by the ion beam column 1. Incidentally, the coincidence of the aiming positions of the beams in this specification is not limited to a case where the positions irradiated with the ion beam and the electron beam coincide completely with each other. And for example, when the GUI of the console observes a SIM image by an ion beam or a SEM image by an electron beam in a SIM/SEM screen display section 64 (see FIG. 10) of a screen 60, the coincidence of the aiming positions also includes a case where the positions are spaced from each other to such an extent that the two aiming positions of the ion beam and the electron beam can be simultaneously grasped within the SIM/SEM screen display section 64.

In the construction of FIG. 2, it is impossible to perform the observation of the processing condition by the ion beam 11 under a SEM simultaneously with the processing. However, by ensuring that after the processing of the sample 35 by the ion beam 11, a portion to be processed can be irradiated with the observational ion beam from the ion beam column 1 at an angle different from the angle of the processing ion beam by inclining the stage 9 and the sample holder 8 or by causing the ion beam column 1 to revolve around the processed portion of the sample 35, it is possible to observe the processed portion of the sample 35 by using the ion beam column 1 on the first unit 100A side without moving the stage 9 to the second unit 200A side in order to make an observation by the electron beam column 6B, though waiting time for inclination and driving is required.

Incidentally, the arrangement of each column and each unit is not always limited to the constructions shown in FIGS. 1 and 2, and various design changes are possible so long as the picking-out of a microsample, the observation of the section of a sample, and the pollution measurement of ion beams can be carried out.

<Ion Beam Column 1>

Figure 3:
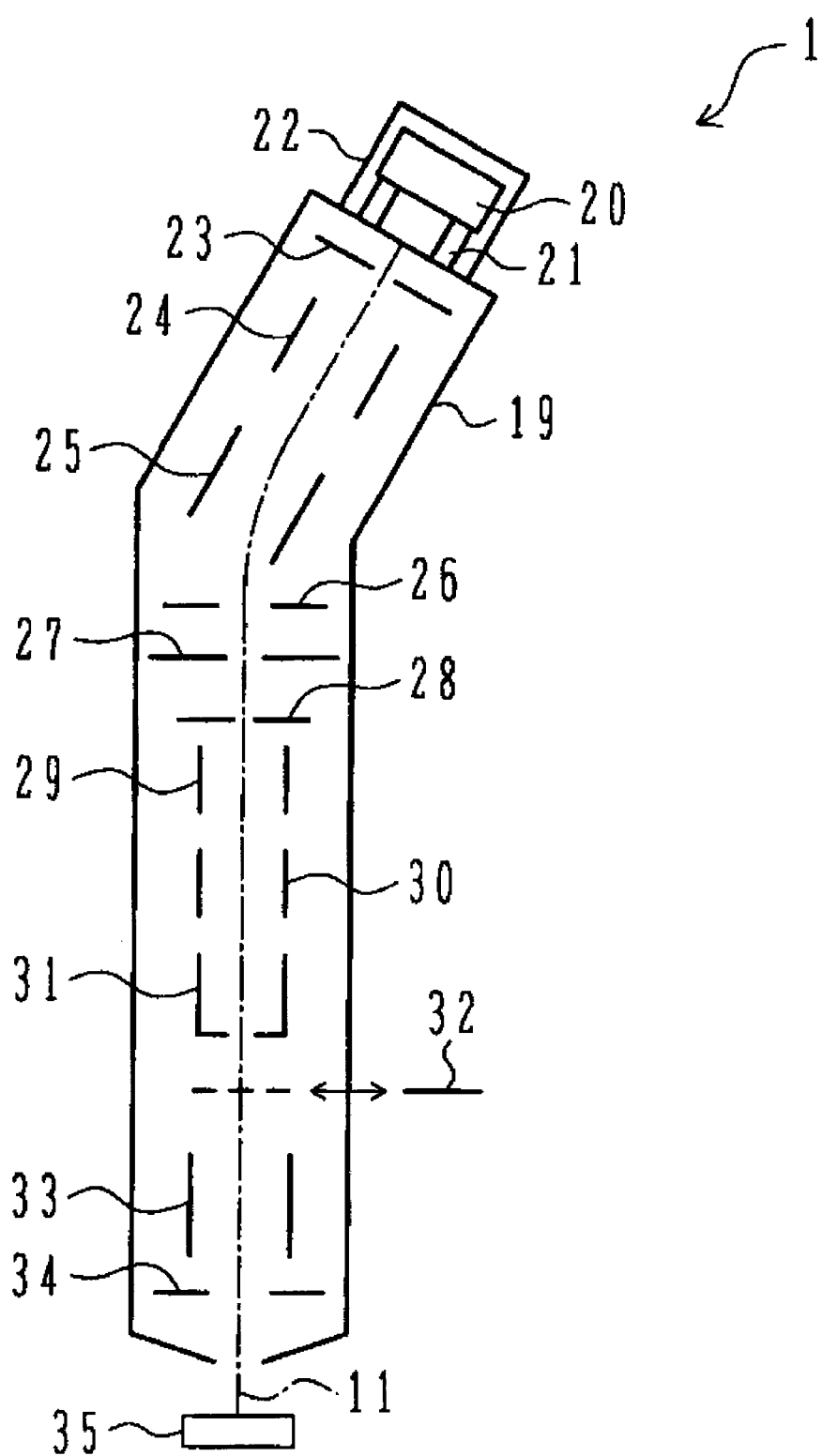
FIG. 3 is a diagram showing the internal structure of an ion beam column.

FIG. 3 is a diagram showing the internal structure of the ion beam column 1.

In FIGS. 1 and 2, the ion beam column 1 is arranged so that the sample 35 is irradiated with the ion beam 11 from a direction inclined with respect to the vertical plane. For the sake of simplicity, however, FIG. 3 illustrates the ion beam column 1 in such a position that the sample 35 is perpendicularly irradiated with the ion beam 11.

A housing 19 of the ion beam column 1 is connected to a vacuum vessel 10, and an ion generation source 20 is provided on an end of the housing 19 via an insulator 21. The ion generation source 20 is isolated in terms of electric potential with respect to the housing 19 by using the insulator 21. For example, the electric potential of the ion generation source 20 is about 30 kV higher than the electric potential of the housing 19. The ion generation source 20 is air-insulated and is covered with an ion generation source cover 22, whereby exposure to a high-voltage exterior is prevented. For example, a duoplasmatron that emits oxygen ion beams can be used as the ion generation source 20. However, it is also possible to use nonmetallic elements, such as nitrogen, and inert gas species (rare gases), such as argon, neon, xenon and krypton, in addition to oxygen. Ion beams are extracted from this ion generation source 20 by an extraction electrode 23.

The processing optical system is constituted by a mass separator 24, a deflector 25, an aperture 26, an irradiation lens 27, a projection mask 28, an astigmatic corrector 29, a blanker 30, a Faraday cup 31, a gun valve 32, a scanning electrode 33, a projection lens 34 and the like.

The housing 19 is formed to be bent by a setting angle (for example, 3 degrees or so) so that the output axis of an ion beam from the ion generation source 20 is inclined with respect to the incidence axis of the ion beam 11 incident on the sample 35. As a result of this, neutron particles of sputtered metal materials generated from inside the ion generation source 20 do not directly reach the sample 35 and are applied to a damper (not shown). The damper is made of silicon, carbon and the like in order to prevent metal pollution by sputter particles.

The mass separator 24 and the deflector 25 are intended for taking out only a target ion species (an oxygen ion in this example) that is used as a processing ion beam 11 of the sample 35 from ion beams extracted from the ion generation source 20 and causing the target ion species to pass through the aperture 26. The applied voltage and magnetic flux density of the mass separator 24 and the deflector 25 are adjusted so that the sample 35 is thus irradiated with the ion beam 11 of the target ion species from the ion beams taken out of the ion generation source 20. In this example, ion beams other than the oxygen ion beam are removed by being applied to the surface of the aperture 26 and it is ensured that only the oxygen ion beam passes through the aperture 26.

In order to reduce the aberration of the ion beam 11 on the sample 35, the applied voltage to the irradiation lens 27 is adjusted so that light is condensed in the position of the principal focus of the projection lens 34.

Figure 4:
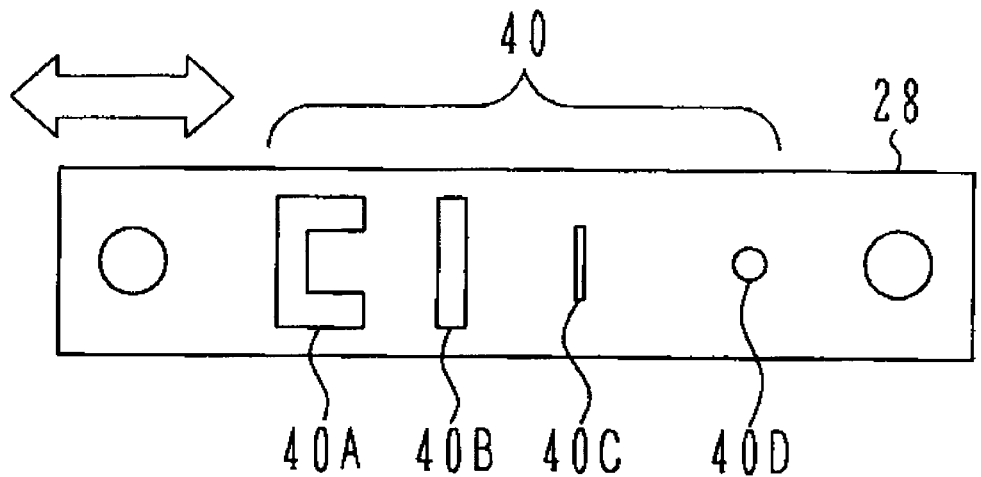
FIG. 4 is an overview diagram of a projection mask provided in an ion beam column.

FIG. 4 is an overview diagram of the projection mask 28.

The projection mask 28 is provided with a plurality of mask holes 40 that control the sectional shape of the ion beam 11 according to the nature of work in cutting out a microsample and observing the sample 35. The first unit 100 (or 100A) of this apparatus is provided with a driving unit (not shown) for driving the projection mask 28. The projection mask 28 is moved by the driving unit in the directions indicated by the arrow in FIG. 4 and any one of the holes 40A to 40D is moved onto the beam axis. That is, by causing the ion beam 11 to pass through any one of the mask holes 40, the sectional shape of the ion beam is adapted to the shape of the hole through which the ion beam 11 has passed.

In this example, a U-shaped hole 40A, a rectangular hole 40B, a slit-like hole 40C with a large vertical-to-horizontal aspect ratio for thin film processing, a round hole 40D are prepared as the mask hole 40. The holes 40A to 40C are holes for ion beam shaping. The holes 40A and 40B are holes for shaping the ion beam for cutting out a microsample, and the hole 40C is a hole for shaping the ion beam that thin-film processes a microsample. The hole 40D is a hole for shaping the ion beam for observations under a SIM. A beam that has passed through any one of these holes 40A to 40D is condensed by the projection lens 34 and is applied to the sample 35.

The slit hole 40C is such that the transverse length (narrow side length) thereof is several times as small as the longitudinal length (wide side length) thereof. When the ion beam 11 is caused to pass through the slit hole 40C, the slit hole 40C is widely distributed from the beam center in the longitudinal direction (the vertical direction in FIG. 4) in the diameter range of the ion beam 11 applied to the projection mask 28, whereas the transverse distribution (the horizontal direction in FIG. 4) is narrow. That is, for the ion beam 11 that has passed through the slit hole 40C, the aberration in the transverse direction is smaller than the aberration in the longitudinal direction. Therefore, for edges of a processed hole formed in a microsample by the ion beam 11 that has passed through the strip-shaped slit hole 40C, an edge formed by a portion of the ion beam 11 corresponding to the wide side of the section is sharper than an edge formed by a portion corresponding to the narrow side.

For the size of the mask hole 40, in FIG. 4 for example, the wide side (the vertical dimension in FIG. 4) of the U-shaped hole 40A is on the order of 400 μm. And the beam reduction ratio by the irradiation lens 27 and the projection lens 34 expected when the sample 35 is irradiated with the beam is adjusted to the order of 1/20. In this case, beams of several hundreds of nanoamperes are obtained as ion beams for processing and beams of several tens of nanoamperes having a diameter on the order of approximately 200 nm are obtained as observational electron beams. This contributes to the cutting-out processing of microsamples by large-current designs and an increase in speed in the thin-film processing of microsamples.

The astigmatic corrector 29 performs the function of adjusting the sectional shape of the ion beam 11 and improving the resolution by reducing aberrations. For example, an 8-pole astigmatic corrector can be used as the astigmatic corrector 29.

The blanker 30 has the function of deflecting the ion beam 11, and the Faraday cup 31 measures the current value of the ion beam 11. The gun valve 32 is a valve that opens and closes the inner space of the housing 19 and serves as a partition wall that separates the inner space of the housing 19 when stopping up the interior of the housing 19. By separating the housing 19 by the gun valve 32, a sample chamber where the sample 35 is placed and part of the ion beam column 1 (on the ion generation source 20 side) are isolated from each other. For example, the gun valve 32 is closed when only the sample chamber is released to the atmosphere for the maintenance of the sample chamber. The scanning electrode 33 is used to scan the ion beam 11, which has passed through the projection mask 28 and has been shaped in a desired sectional shape, on the sample 35, and for example, an eight-electrode type can be used.

<Microsampling Unit 3>

The microsampling unit 3 picks out a microsample that has been cut out of the sample 35 by the ion beam 11 from the ion beam column 1 by use of the probe 16 as a manipulator. For the probe 16, a movement range on the order of several millimeters each in triaxial directions and submicrometer-level positioning accuracy are ensured. The probe 16 contains silicon as the main component thereof in order to prevent metal pollution, and contains a trace amount of boron in order to have electrical conductivity. However, because it is difficult to fabricate the whole probe 16 from silicon, it is conceivable that for example, only an appropriate length (for example, 2 mm or so) in the whole length (for example, 15 mm or so) is made of silicon. Incidentally, although the length of a portion made of silicon is not limited, a length of about 2 mm is easily fabricated, because it is generally difficult to obtain silicon plate materials exceeding 2 mm in thickness.

Although this is not illustrated, it is preferred that the leading end of the silicon portion of the probe 16 have an apex angle of approximately 40 degrees and a bottom surface in the shape of an octagon. This shape is fabricated by anisotropic etching with a wet etching solution and cutting by dicing. This shape is inserted into a hole portion of a metal bar, the joint is bonded by an electrically conductive adhesive material and heat treated. The microsampling unit 3 has an interlock function for limiting the movement range of the probe 16 to adapt to magnifications during the observation and processing of the sample 35 and not to prevent the occurrence of metal pollution by the irradiation of the metal part of the probe 16 with ion beams.

<Gas Gun 2 and Electron Beam Gas Gun 5>

The gas gun 2 will be described here. It is possible to use an electron beam gas gun 5 having almost the same construction as the gas gun 2.

Figure 5:
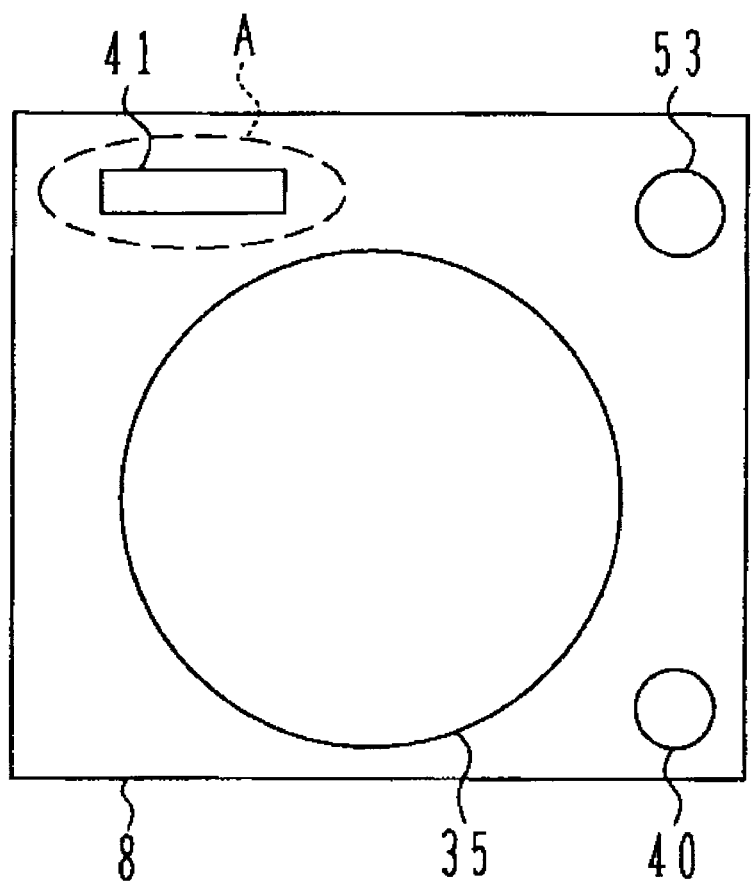
FIG. 5 is a top view of a sample holder.
Figure 6:
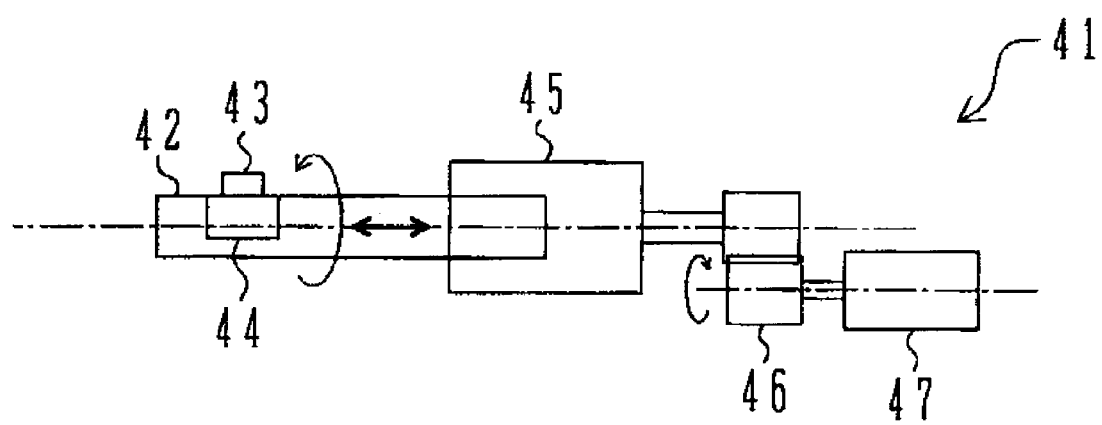
FIG. 6 is a detail view of Part A in FIG. 5.

The microsample 43 (see FIGS. 5 and 6) cut out of the sample 35 by the ion beam 11 is bonded to the probe 16, separated from the sample 35, and bonded to a bed called a mesh (see the mesh 44 in FIGS. 5 and 6). And the microsample 43 is taken out by the probe 16 to outside this apparatus. The gas gun 2 discharges a deposition gas used in the bonding step in a series of work of picking out and thin-film processing the microsample 43 and taking out the microsample 43 to outside this apparatus.

In picking out the microsample 43, with the leading end of the probe 16 kept in contact with the surface of the portion of the sample 35 to be picked out, the ion beam 11 is scanned while a deposition gas from the gas gun 2 is being discharged to the periphery of the leading end of the probe 16, whereby the probe 16 and the microsample 43 are bonded together by a deposition film. At this time, by using an ion beam shaped by the hole 40A of FIG. 4, for example, in the form of the letter U in section a hole is processed so as to scoop a defective part of the sample 35, this part is separated as the microsample 43, the probe 16 is bonded to a prescribed area, and the microsample 54 is separated from the sample 35 by using an ion beam shaped by the hole 40B in the form of a rectangle in section. This causes the microsample 43 to be picked out of the sample 35. In separating the microsample 43 from the probe 16, the deposition film connecting the probe 16 and the microsample 43 together is irradiated with an ion beam and removed by sputtering, the probe 16 is cut, and the micro sample 43 is disconnected.

As the material deposition gas that is discharged from the gas gun 2, it is possible to use carbon-based gases in which a formed film does not cause metal pollution, such as phenanthrene, in addition to elements not containing metal elements to prevent metal pollution, for example, TEOS (tetraethoxysilane), which is a compound of silicon, carbon, oxygen and hydrogen. During processing, the gas is injected to a portion to be bonded, with the gas nozzle 17 of the gas gun 2 made close to a processing point. When processing is not performed, the gas nozzle 17 is retracted from the processing point in order to prevent interference with the stage 9 during the inclining of the stage 9.

<Sample Holder 8 and Stage 9>

Although a five-axis stage, for example, is used as the stage 9, it is also possible to use a four-axis stage not containing an inclining mechanism if the ion beam column 1 and the electron beam column can be inclined.

FIG. 5 is a top view of the sample holder 8 and FIG. 6 is a detail view of Part A in FIG. 5.

On the top surface of the sample holder 8, there is provided a beam adjusting jig 40 for performing focus adjustment and astigmatic adjustment of ion beams and electron beams in places other than the region where the sample 35 is placed. Part of a silicon substrate of an appropriate size (for example, 20 mm or so in diameter), on which a pattern is formed, is bonded to the top surface of the beam adjusting jig 40. The beam adjusting jig 40 has a construction that enables the beam adjusting jig 40 to be attached and detached to and from the sample holder 8.

Furthermore, on the top surface of the sample holder 8, there is provided a cartridge unit 41 that holds the microsample 43 in thin-film processing the microsample 43 that has been cut out and in taking out the microsample 42 to outside the charged particle beam processing apparatus of this embodiment and delivering the microsample 43 to another device (for example, a TEM or a STEM).

This cartridge unit 41 bonds the microsample 43 (having a size on the order of several tens of micrometers on a side, for example), which has been picked up by the probe 16 and the gas gun 2 from the sample 35, to the mesh 44 (having a size on the order of several tens of micrometers in width, for example). The mesh 44 is fixed to a cartridge 42 performing the function of an arm of the cartridge unit 41. The cartridge 42 is attached to the cartridge holder 45, which is rotatably provided in the sample holder 8, so as to be capable of being inserted and extracted. The cartridge holder 45 is rotated by a driving and transmission system of a motor 47, a gear 46 and the like provided in the sample holder 8.

FIGS. 7A, 7B, 7C, 7D and 7E are diagrams that show how the microsample 43 bonded to the mesh 44 is thin-film processed within the vacuum vessel 10. These figures show diagrams obtained when the cartridge 42 is viewed from the leading end side.

Figure 7:
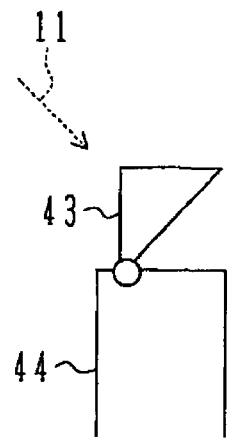
FIGS. 7A, 7B, 7C, 7D and 7E are diagrams that show how a microsample bonded to a mesh is thin-film processed.
Figure 7:
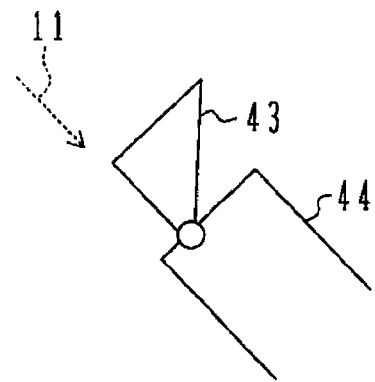
Figure 7:
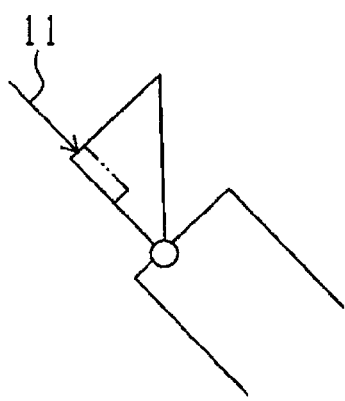
Figure 7:
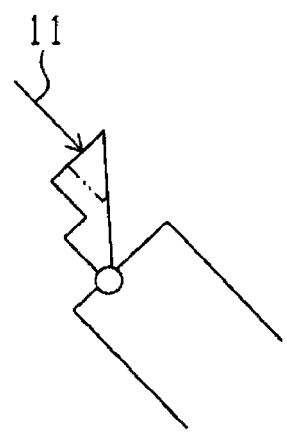
Figure 7:
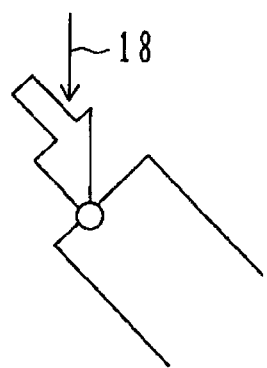

As already described, the microsample 43 picked out of the sample 35 is moved by driving and controlling the stage 9 onto the mesh 44 of the cartridge unit 41 and after that, the microsample 43 is bonded to the mesh 44 by a deposition gas from the gas gun 2 in the same manner as described above. After that, the microsample 43 is separated by the ion beam 11 from the probe 16, with the result that microsample 43 is mounted on the mesh 44 and fixed thereto. And the microsample 43 bonded to the mesh 44 is moved to the beam axis position of the ion beam 11 by moving the stage 9 (FIG. 7A). At this time, the motor 47 of the cartridge unit 41 is driven, whereby the cartridge 42 is rotated so that the depth direction of a processed hole to be formed in the microsample 43 is aligned with the incidence axis direction of the ion beam 11 (FIG. 7B).

After the adjustment of the angle of the microsample 43, the microsample 43 is irradiated with the ion beam 11 and thin-film processed, whereby the microsample 43 is processed with a desired shape (for example, a thin film of an approximately 200 nm thickness in the case of an observation under a TEM or a STEM) (FIGS. 7C and 7D). After the thin-film processing, the thin-film processed microsample 43 is irradiated with the observational electron beam 18 of electron beam column 4 (or 6B) by rotating the cartridge 42 or moving the stage 9 as required, whereby the thin-film portion of the microsample 43 is observed (FIG. 7E). If a shift to the observation of the microsample 43 by the electron beam column 4 or 6B of FIG. 7E can be made without the rotation of the cartridge 42 in situ (in the place of the thin-film processing by the ion beam 11) or only through the movement of the stage 9, the positioning accuracy is high compared to a case where positioning is performed by rotating the cartridge 42.

The cartridge 42 can be taken out of the cartridge unit 41. Therefore, when it is necessary to observe the microsample 43 with a higher resolution than the electron beam columns 4 or 6B, the cartridge 42 is detached from the cartridge unit 41 by use of an unillustrated attaching/detaching mechanism, and taken out of the charged particle beam processing apparatus of this embodiment, and the cartridge 42 that has been taken out is mounted on a holder that is separately provided. As a result of this, it is possible to irradiate the microsample 43 with the electron beam 18 as shown in FIG. 7E by using a STEM or a TEM provided separately from this apparatus, to detect transmitted electrons of the electron beam 18, and to perform the observation and analysis of a transmitted electron image of the microsample 43 with a subnanometer-level resolution. When the electron beam column 4 or 6B in this apparatus shown in FIG. 1 is constituted by a STEM or a TEM instead of a SEM and a dark field/bright field detector (not shown) is used, it is also possible to perform the observation and analysis of an image of electrons that have passed through the thin-film processed microsample 43 to thereby observe the image with a higher resolution.

Incidentally, the observational electron beam columns 4 and 6B shown in FIGS. 1 and 2 are used also to observe a processed section of the sample 35 after the picking-out of the microsample 43 in addition to the observation of the picked-out microsample 43. When a processed section is to be observed, it is effective that a defective part that has been detected by another inspection device, for example, is identified by a coordinate linkage and an earmark is put beforehand near the processed section by performing marking with an ion beam.

<Pollution Monitoring Jig 53>

As shown in FIG. 5, on the top surface of the sample holder 8, there is provided a pollution monitoring jig 53, which determines whether a metal is not contained in the ion beam 11 of the ion beam column 1, in a region other than the space where the sample 35 is placed. The pollution monitoring jig 53 is provided with a sample 54 formed from silicon and the like (see also FIG. 9). And in this apparatus, contamination by the ion beam 11 can be measured by irradiating the sample 54 with the ion beam 11 before the processing of the sample 35 in the first unit 100 or 100A. After the sample 54 has been irradiated with the ion beam 11, the stage 9 is moved to the second unit 200 or 200A side, and the irradiation traces of the ion beam 11 in the sample 54 are irradiated with the pollution measuring beam 13 from the pollution measuring beam column 6A (or 6B). And a characteristic X-ray 57 emitted from near the ion beam irradiation traces of the sample 54 is detected by the detector 7, whereby whether metal contamination of the ion beam irradiation traces of the sample 54 has occurred, is determined, that is, whether a metal ion species or a sputtered metal material is contained in the ion beam 11 is determined.

Figure 8:
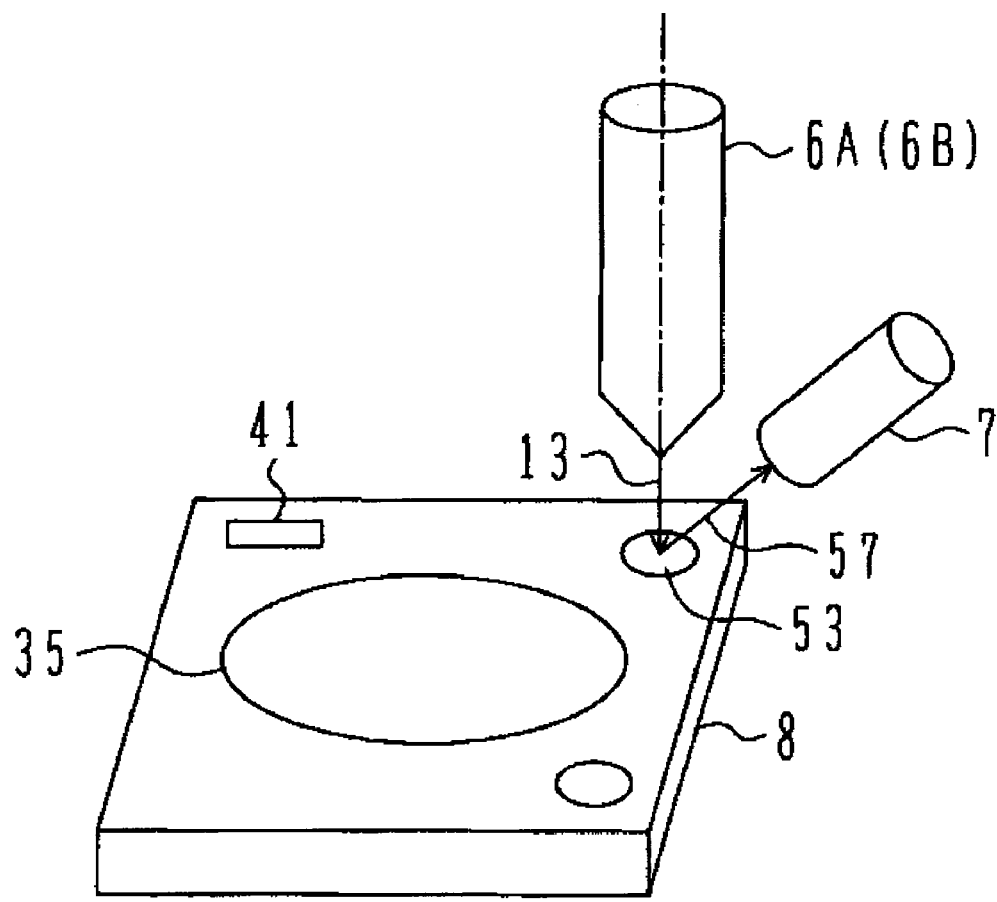
FIG. 8 is a diagram that shows how a characteristic X-ray, which is generated when a sample provided in a pollution monitoring jig is irradiated with a pollution measuring beam, is detected by a detector.

FIG. 8 is a diagram that shows how the characteristic X-ray 57, which is generated when the sample 54 provided in the pollution monitoring jig 53 is irradiated with the pollution measuring beam 13, is detected by the detector 7.

Figure 9:
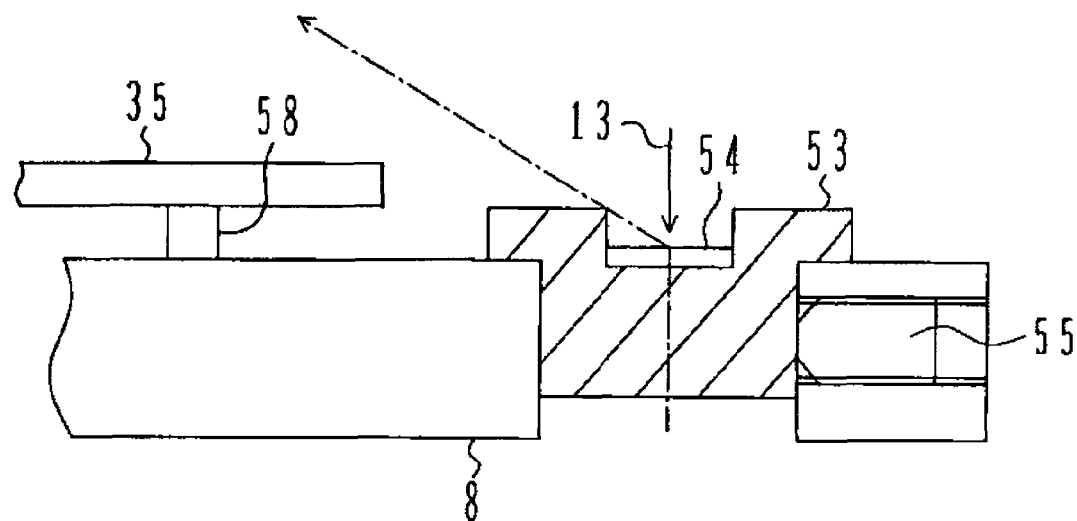
FIG. 9 is a partial sectional view of a sample holder that shows the construction of a pollution measuring jig.

FIG. 9 is a partial sectional view of the sample holder 8 that shows the construction of the pollution measuring jig 53.

The range in which metal pollution that poses a problem occurs is generally on the order of several millimeters when, for example, the dose is 1012 pieces or so and the irradiation region is on the order of several tens of micrometers. Therefore, if the pollution monitoring jig 53 is as much as several tens of millimeters apart from the sample 35 disposed on the sample holder 8 via a supporting jig 58, then metal pollution does not spread to the sample 35 during the irradiation with the ion beam 11 even when a metal is contained in the ion beam 11. However, when pollution measurement is made, with the sample 35 set on the sample holder 8, in order to ensure that a sputtered material generated by the irradiation of the sample 54 with the ion beam 11 does not directly reach the sample 35, the sample 54 is disposed in a depression of the pollution monitoring jig 53 so that the sample 35 is not seen directly from the irradiation traces of the ion beam 11 in the sample 54. That is, the elevation angle of the inner wall portion of the depression of the pollution monitoring jig 53 from the irradiation traces of the ion beam 11 in the sample 54 is larger than the elevation angle of the sample 35 similarly from the irradiation traces, so that the inner wall of the depression of the pollution monitoring jig 53 interferes with a sputtered material that is generated in the irradiation traces and moves toward the sample 35.

The pollution monitoring jig 53 has a construction that enables the pollution monitoring jig 53 to be easily attached and detached to and from the sample holder 8. The pollution monitoring jig 53 is fixed to the sample holder 8 by a locking screw 55 that is screwed in from the side surface of the sample holder 8. It is necessary that the irradiation traces of the ion beam 11 of the sample 54 in the first unit 100 (or 100A) be accurately positioned to the aiming position of the pollution measuring beam 13 to which irradiation is performed in the second unit 200 (or 200A). In this case, rough adjustment is first made by the positioning function of the stage 9 based on the coordinate data of the processed hole of the sample 54, the beam output of the pollution measuring beam column 6A or 6B is reduced for observational purposes, and fine adjustment of the position of the stage 9 is made while looking at a SEM observation image of the surface of the sample 35, whereby the irradiation traces of the ion beam 11 are caused to coincide accurately with the aiming position of the pollution measuring beam 13.

An outline of an X-ray element analysis method is given below.

When a pollution measuring beam (a high-energy electron beam or an X-ray) becomes incident on an element, core electrons are emitted by a collision, and characteristic X-rays and the like are emitted when the core electrons make a transition. For example, an X-ray emitted when electrons make a transition to holes formed after the emission of the core electrons of the K-shell is called the K-line X-ray, and in the case of the L-shell and M-shell, such an X-ray is called respectively the L-line X-ray and M-line X-ray. There are various X-rays of this type in addition to these X-rays.

When the sample 54 is irradiated with a pollution measuring electron beam, various characteristic X-rays 57 peculiar to each element are emitted as described above. For example, if the detector 7 is a silicon (lithium) X-ray detection element, silicon atoms are ionized by the photoelectric effect when the characteristic X-ray 57 becomes incident on the detector 7, with the result that an electron-hole pair is formed. This charged body is collected by positive and negative electrodes and detected as a pulsed current. The number of pulses of the detected current becomes the count number of a pulsed current proportional to the energy of the incident characteristic X-ray 57. Therefore, it is possible to determine the element of the sample 54 and elements adhering to this element from the energy of the detected characteristic X-ray 57 and the number of pulses of the current.

Incidentally, an analysis method that measures the elements and the contents of elements contained in an inspection object by irradiating the inspection object with an X-ray instead of an electron beam and observing an emitted fluorescent X-ray is called the total reflection X-ray fluorescence analysis method.

<Operation Screen>

Figure 10:
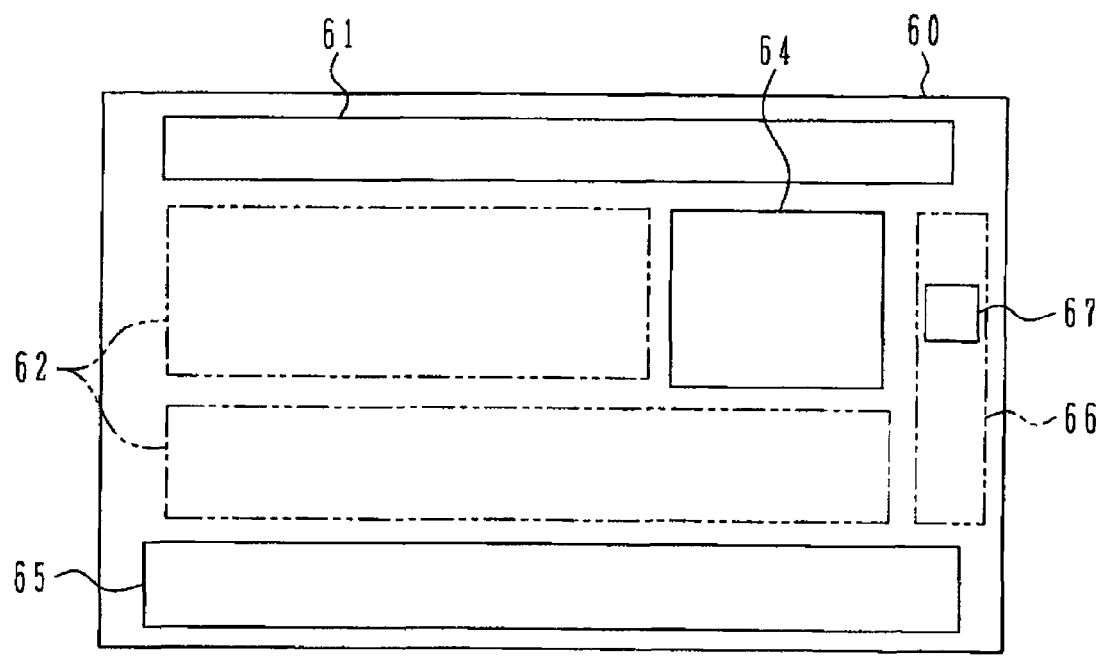
FIG. 10 is a diagram showing a GUI screen displayed on a display unit of a console in a charged particle beam processing apparatus related to an embodiment of the present invention.

FIG. 10 shows a graphical user interface screen (hereinafter called a GUI screen) displayed on a display unit of a console (not shown) provided in the charged particle beam processing apparatus of this embodiment.

The GUI screen 60 is constituted by an alarm display section 61, a beam parameter display section 62, a SIM/SEM screen display section 64, a navigation panel 65, and a command panel 66.

The navigation panel 65 is a region for changing over operations, and provides a menu of jobs in which the operator performs processing on the basis of recipes, manual operation and maintenance.

On the command panel 66, there are displayed commands for performing operations, such as the application of high voltage to the ion generation source and beam current measurement. When a pollution monitoring button 67 on the command panel 66 is turned on, the sample 54 is automatically irradiated with the ion beam 11, and then the stage 9 moves. The stage 9 moves the sample 54 within the pollution monitoring jig 53 to just under the pollution measuring beam (aiming position). The sample 54 is irradiated with the pollution measuring beam 13, and the emitted characteristic X-ray 57 is caught by the detector 7 and analyzed by a controller (not shown) of the detector 7, whereby the pollution condition of the sample 54 (i.e., the ion beam 11) is measured. Examples of the measurement results are shown in FIGS. 11 and 12.

Figure 11:
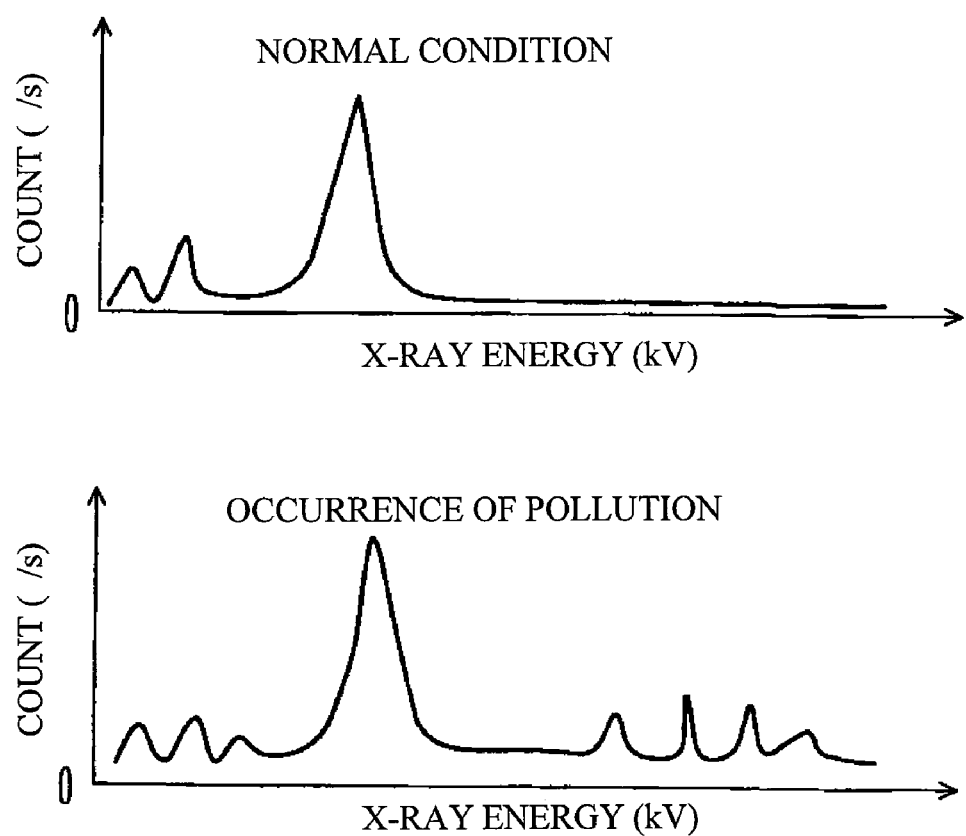
FIG. 11 is a diagram showing an example of results of a qualitative analysis by an EDS detector, which is a kind of detector.

FIG. 11 is a diagram showing an example of results of a qualitative analysis by an energy dispersive X-ray spectrometer (hereinafter abbreviated as EDS), which is a kind of detector.

In this example, the applied voltage of the pollution measuring beam 13 that is used in the irradiation in the second unit 200 or 200A is adjusted to the order of 15 kV in order to accurately analyze all of the elements of the periodic table and the current is on the order of several hundreds of picoamperes. As shown in the upper diagram of FIG. 11, silicon that is the main component of the sample 54 is the main component of the beam in a normal condition, whereas when metal pollution occurs, the element line of the X-ray of higher energy than silicon is more observed than in a normal condition, as shown in the lower diagram of FIG. 11. In the charged particle beam processing apparatus of this embodiment, there is a possibility that chromium, iron, nickel, copper, gold and the like are detected. There is a possibility that chromium, iron and nickel are emitted from the stainless steel material used on the electrode of the ion beam column 1 and the inner surface of the column and that gold is discharged from the surface of the astigmatic correction eight-pole electrode.

Figure 12:
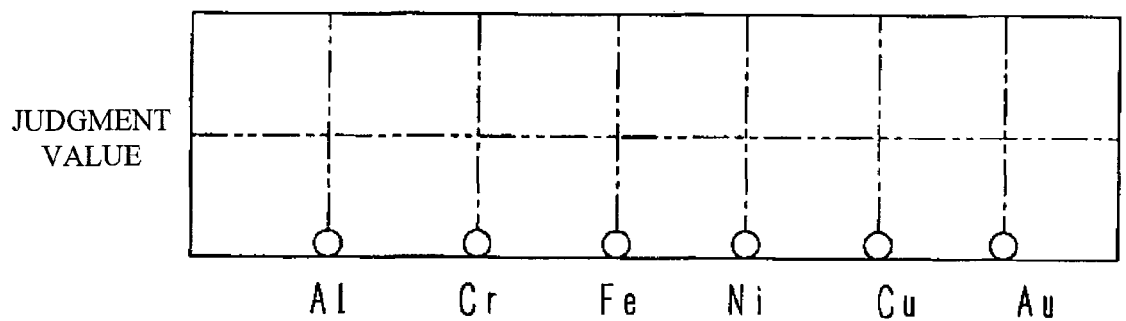
FIG. 12 is a diagram showing an example of results of a quantitative analysis based on the results of the qualitative analysis.
Figure 12:
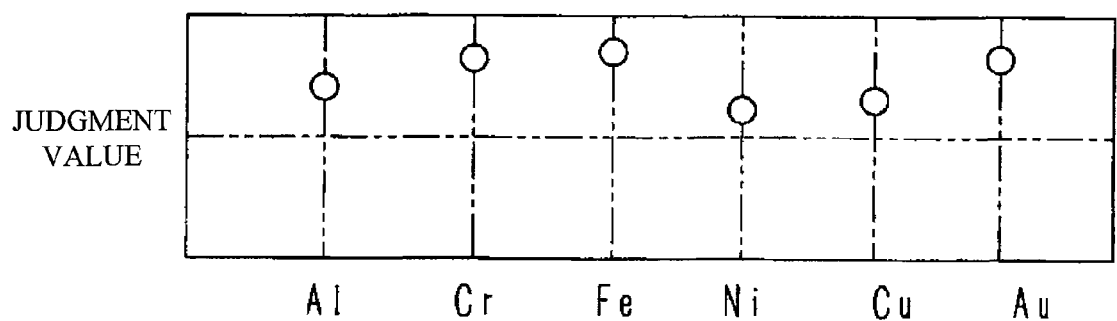

FIG. 12 is a diagram showing an example of results of a quantitative analysis based on the results of the qualitative analysis. Quantified metal species are indicated as the abscissa and the weight component ratio is indicated as the ordinate.

In performing a quantitative analysis, one or more element lines are input for elements to be quantified, which are selected from the elements detected as shown in the lower diagram of FIG. 11, and then the weight component ratios (wt %) of the elements contained in the portion of the sample 54 irradiated with the ion beam 11 are found by a quantitative analysis program of EDS stored in an unillustrated controller. The elements to be quantified may also be found from the elements contained in parts used in the processing optical system of the ion beam column.

In making a pollution judgment, judgment values for judging a normal condition and an abnormal condition (occurrence of metal pollution) are set for each element beforehand and a judgment is passed as to whether the condition is normal or abnormal by comparing the result of a quantitative analysis with the judgment values. The condition is normal when as shown in the upper diagram of FIG. 12, the results of the quantitative analysis are not more than the judgment values for all of the analyzed elements. The condition is abnormal when as shown in the lower diagram of FIG. 12, the results of the quantitative analysis of any one of the elements exceed the judgment values. Incidentally, the lower diagram of FIG. 12 illustrates a case where all of the elements are above the judgment values. Furthermore, although in FIG. 12, the same judgment value is adopted for each element, judgment values may also be individually set for each element.

Figure 13:
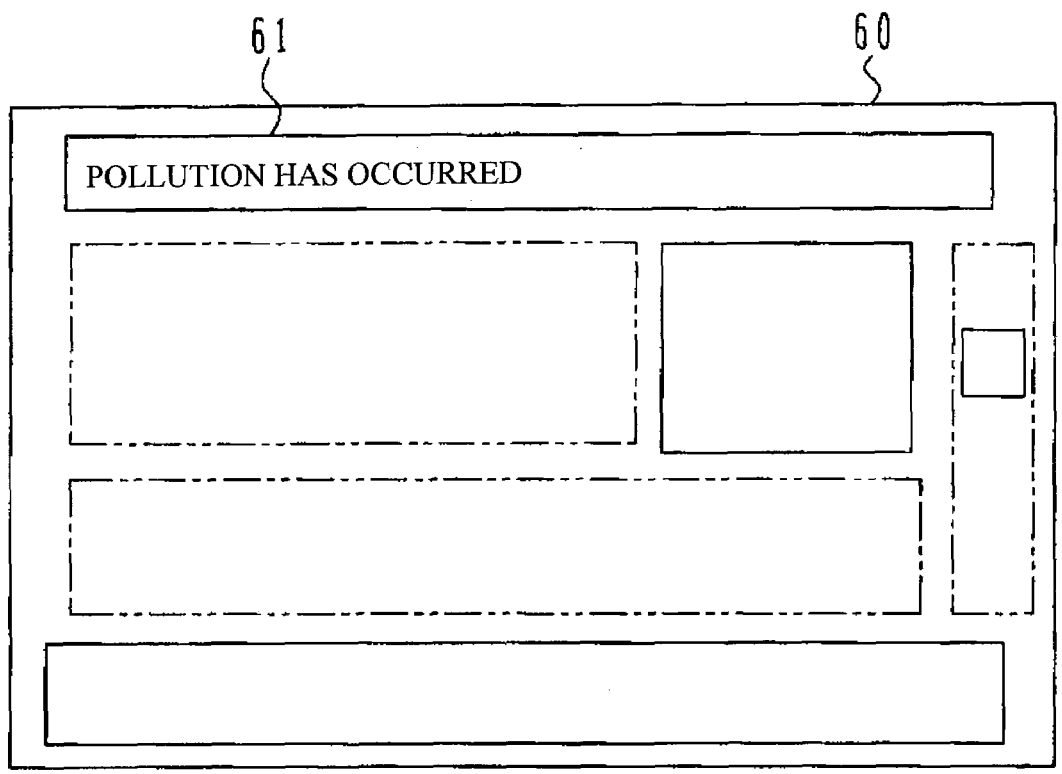
FIG. 13 is a diagram showing an example of a display of a GUI screen upon occurrence of pollution.

FIG. 13 is a diagram showing an example of a display of the GUI screen 60 upon occurrence of pollution.

FIG. 13 shows a case where the warning "POLLUTION HAS OCCURRED" is displayed in the alarm display section 61 and an alarm sound is emitted as an example of informing the operator upon occurrence of pollution of the occurrence of pollution. In addition to the warning by letters and sounds like this, it is also conceivable that warning colors (red and the like) are caused to light up or blink. A terminal in the service center connected to this charged particle beam processing apparatus via a network may be automatically informed via network of the fact that pollution has occurred, or the operator who has recognized the occurrence of pollution by warning may communicate with the service center. Conceivable measures taken by the service person who has been informed of the occurrence of pollution are broadly divided into the following two.

One is a method that involves continuing to irradiate the sample 54 of the pollution monitoring jig 53 with the ion beam 11 until a pollutant within the processing optical system becomes not more than the relevant judgment value. In this case, the irradiation of the sample 54 with the ion beam 11 and the checking of the degree of pollution are continued, and finished when the degree of pollution by the pollutant of the measurement object has become below a judgment value.

The other is a method that involves identifying a part of the ion beam column 11 to be maintained (a part having a great probability of being polluted) from the results of quantitative and qualitative analyses of elements and cleaning or replacing mainly the part.

It is also possible to adopt the following method. That is, the materials for the ion beam column 1 and electrodes used in the ion beam column 1 are stored beforehand. When pollution has been recognized, the cause of the abnormality is estimated on the basis of the metal ion species exceeding the relevant judgment value (the metal whose presence has been recognized in the irradiation traces of the ion beam) and the content of the pollution control measures is displayed on the alarm display section 61, the navigation panel 66 and the like.

<Description of Operation>

Next, a description will be given of the procedure for pollution measurement and the procedure for defect observation using this charged particle beam processing apparatus of the above-described construction.

1. Procedure for Pollution Measurement

Figure 14:
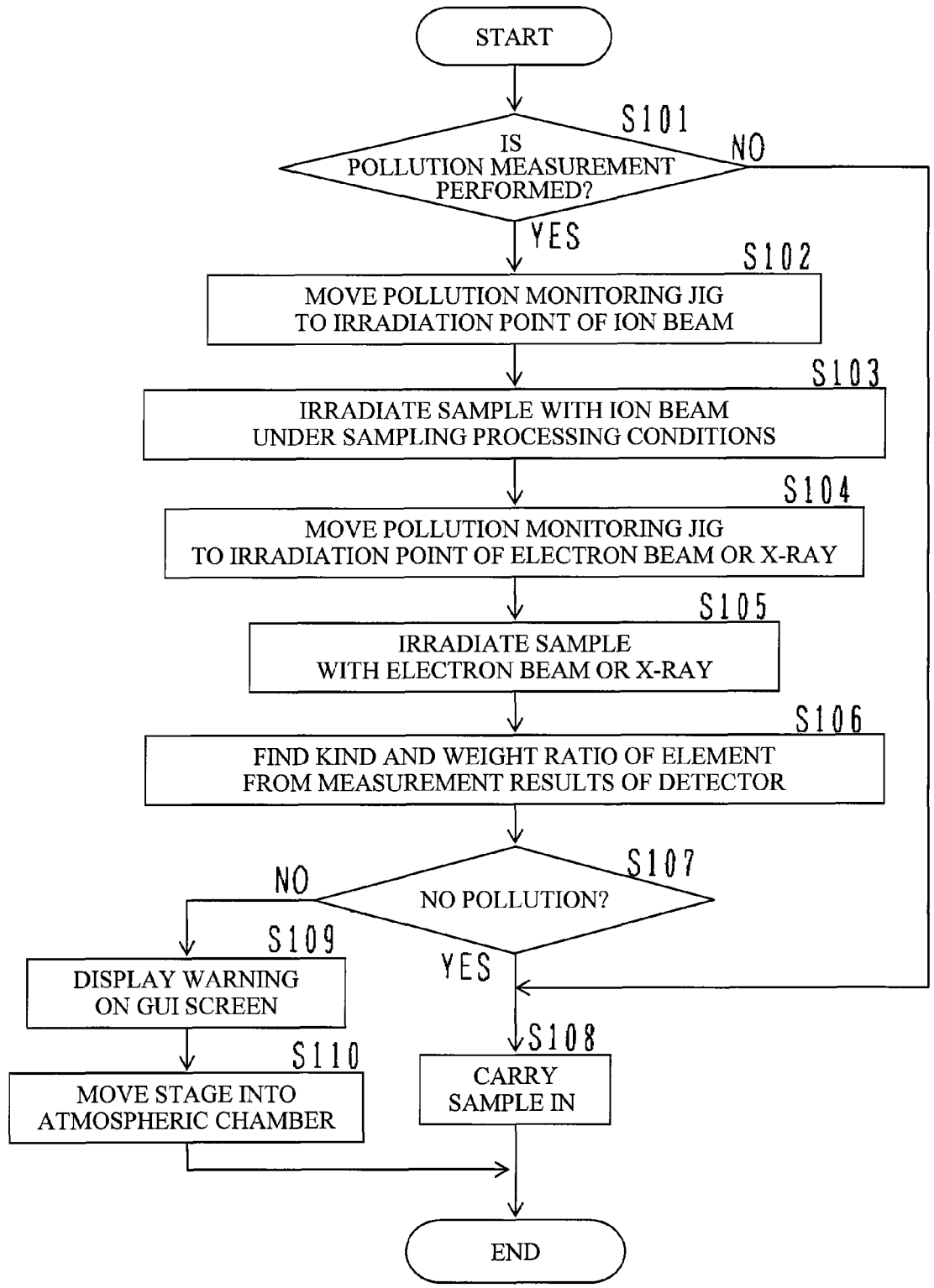
FIG. 14 is a flowchart showing a pollution measurement procedure by a central control unit provided in a charged particle beam processing apparatus related to an embodiment of the present invention.

FIG. 14 is a flowchart showing a pollution measurement procedure by an unillustrated central control unit controlling the whole, which is provided in this charged particle beam processing apparatus.

Pollution measurement is performed before the first processing of the sample 35 after a discharge within the apparatus and a power failure, after the maintenance of the ion generation source 20, after an unsteady operation, such as a change of the beam irradiation conditions, and the like.

Illustrated is a procedure that involves inspecting the degree of contamination of the ion beam column 1 and the ion beam 11 before the carrying of the sample 35 into the sample chamber (the interior of the vacuum vessel 10), carrying the sample 35 into the sample chamber if the sample 35 is found to be normal, and replacing the used pollution monitoring jig 53 if the sample 35 is found to be abnormal.

In carrying the sample 35 into the sample chamber after a startup, first at Step S101, the unillustrated central control unit of the charged particle beam processing apparatus of this embodiment makes a judgment as to whether the pollution measurement of the ion beam 11 is to be made. This judgment is based on whether the pollution monitoring button 67 on the GUI screen 60 of FIG. 10 has been manipulated and the manipulated signal has been input. For example, as in a case where immediately following the processing and observation of a preceding sample for which the processing and observation have been normally finished, the next sample is to be carried in, when it is unnecessary to perform the pollution measurement of an ion beam and the instructions to carry in the sample have been given by the operator without instructions by the pollution measuring button 67, the requirement for the judgment at Step S101 is not met and the central control unit causes the sequence of operations to proceed to Step S108, where the sample 35 is carried into the sample chamber under the instructions from the operator, and the processing of this pollution measuring procedure is finished. On the other hand, when the manipulated signal by the manipulation of the pollution monitoring button 67 by the operators is input and the requirement for the judgment at Step S101 is met, then the central control unit causes the sequence of operations to proceed to Step S102, where the processing of the pollution measuring procedure is started.

At Step S102, to ensure that the sample 54 of the pollution monitoring jig 53 reaches the irradiation traces of the ion beam 11 of the ion beam column 1, the central control unit outputs a command signal to the driving system of the stage 9, moves the stage 9 within the sample chamber to the first unit 100 (or 100A) side, and determines the position of the sample holder 8.

When the sequence of operations has proceeded to Step S103, the central control unit irradiates the sample 54 with the ion beam 11 under the preset processing conditions (conditions such as gas flow rate, extraction voltage, cathode voltage, voltage values of the irradiation lens and projection lens, and mask size) for cutting out and thin-film processing the microsample 43. For example, at an irradiation point, the irradiation area is 20 µm square, the ion beam current value is several hundreds of nanoamperes, the irradiation time is 1 minute, and the ion dose is on the order of the twelfth power of 10.

At Step S104, so that the irradiation traces of the ion beam 11 of the sample 54 of the pollution monitoring jig 53 coincide with the aiming position of the pollution measuring beam 13 of the pollution measuring beam column 6A (or 6B), the central control unit outputs a command signal to the driving system of the stage 9, moves the stage 9 within the sample chamber to the second unit 200 (or 200A) side, and determines the position of the sample holder 8.

When the sequence of operations proceeds to Step S105, the central control unit irradiates the irradiation traces of the ion beam 11 of the sample 54 and the vicinity of the irradiation traces with the pollution measuring beam 13.

At Step S106, the characteristic X-ray 57 emitted from the sample 54 by the irradiation with the pollution measuring beam 13 is detected by the detector 7, and the kind and weight ratio of elements present in the ion beam irradiation traces of the sample 54 are found on the basis of the detection signal (see also FIG. 11).

At Step S107, a judgment is made as to whether pollution has occurred by comparing the value found at Step S106 with the judgment value (see also FIG. 12). When pollution is not recognized as a result of the judgment, the requirement for the judgment at Step S107 is met and the sequence of operations proceeds to Step S108, where the sample 35 is transferred into the sample chamber and the procedure for pollution measurement is finished. When conversely pollution is detected, the requirement for the judgment at Step S107 is not met and the sequence of operations proceeds to Step S109.

When the sequence of operations has proceeded to Step S109, the central control unit displays a warning on the GUI 60 screen and informs the operator of the occurrence of pollution (see FIG. 13). The operator communicates with the service center when he or she has got to know the pollution from a warning display (as already described, the service center may also be automatically informed by a network circuit.)

At Step S110, action is taken by the service person who has been informed. A case where the pollution monitoring jig 53 is replaced is illustrated here. In replacing the pollution monitoring jig 53, the central control unit moves the stage 9 into an atmosphere chamber outside the sample chamber according to a prescribed manipulated signal from the unillustrated console and finishes this procedure for pollution measurement. When the stage 9 has moved into the atmosphere chamber, the service person or the like replaces the pollution monitoring jig 53 of the sample holder 8.

Incidentally, when the manipulation of the pollution monitoring button 67 has been recognized, a program that has been stored in a storage section (not shown) is read in and the processing at Steps S102 to S107 and Step S109 in the procedure for pollution measurement of FIG. 14 is automatically executed by the central control unit according to this program. However, instructions for each of the steps may also be individually given by the console. The processing at Step S108 may also be automatically executed immediately following the processing at Step S107. After ascertaining that the sample 35 has been set, the operator may also manually give instructions.

Subsequently, a description will be given of a procedure for defect observation using this charged particle beam processing apparatus.

2. Procedure for Defect Observation

Figure 15:
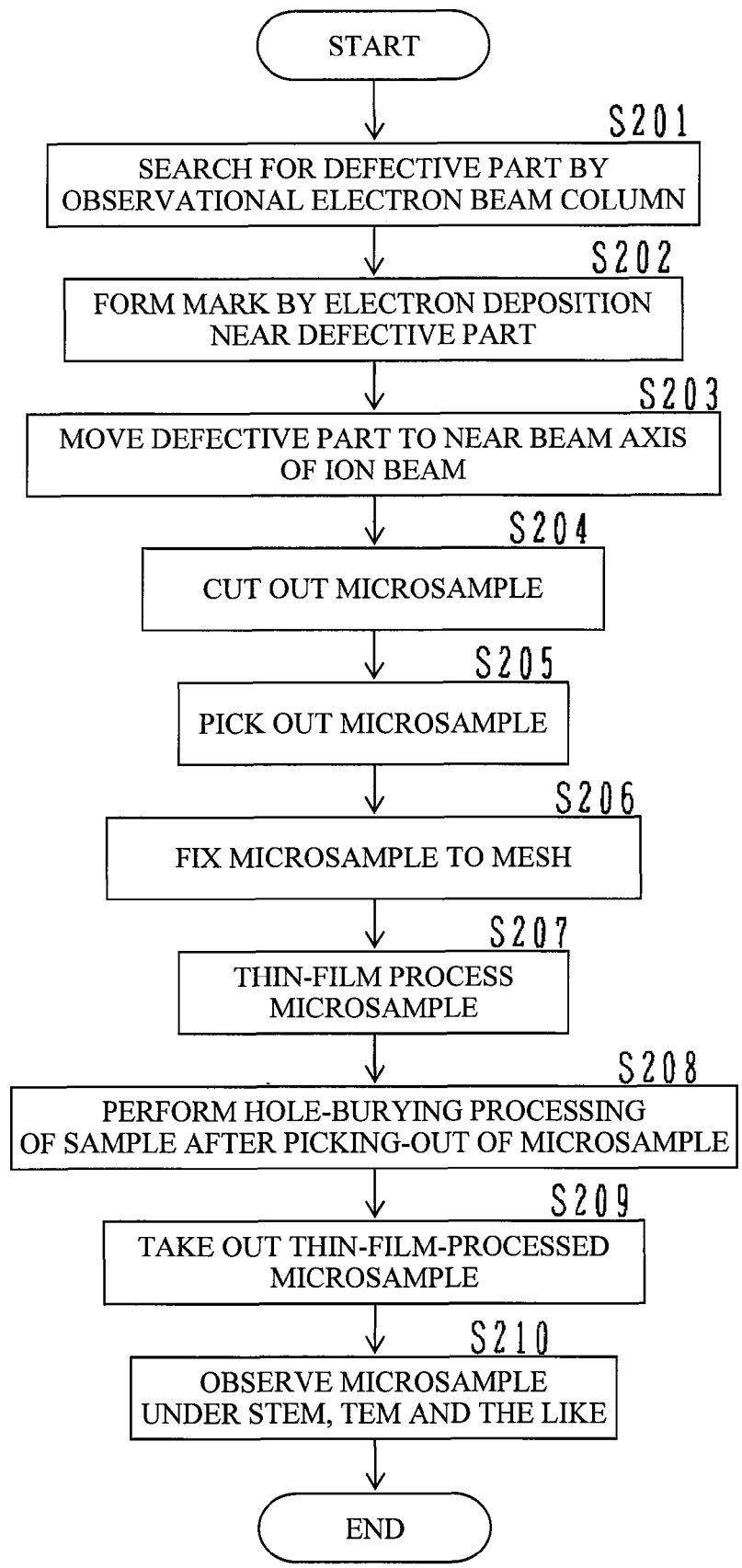
FIG. 15 is a flowchart showing a defect observation procedure using a charged particle beam processing apparatus related to an embodiment of the present invention.

FIG. 15 is a flowchart showing the defect observation procedure using this charged particle beam processing apparatus.

A defect observation is executed by the central control unit on the basis of a manipulated signal input from the console by a prescribed manipulation of the operator after the sample 35 is carried into the sample chamber.

Illustrated is a procedure that involves searching for a defective part of the sample 35 after the carrying of the sample 35 into the sample chamber (the interior of the vacuum vessel 10), picking out and thin-film processing the defective part (the microsample 43), and observing thereafter the thin-film processed microsample 43 by another inspection device (a STEM, a TEM or the like) outside the charged particle beam processing apparatus.

Figure 16:
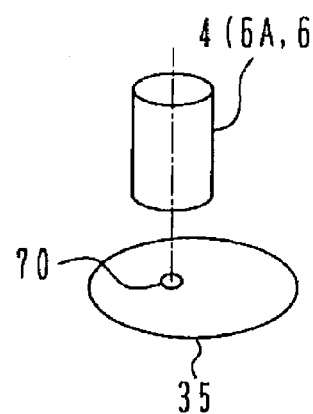
FIGS. 16A, 16B and 16C are diagrams that show how a microsample is extracted.
Figure 16:
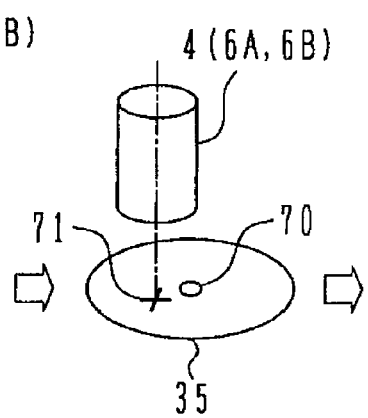
Figure 16:
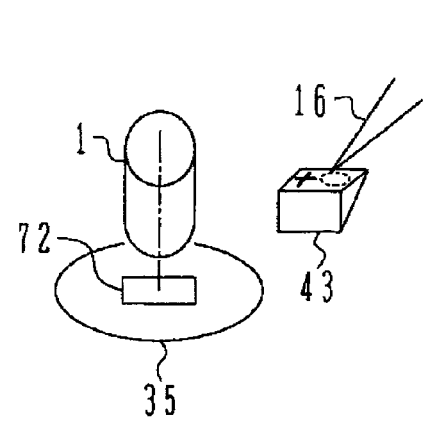

When pollution has not been recognized in the procedure for pollution measurement of FIG. 14 (or when it is unnecessary to perform pollution measurement) and the sample 35 has been carried into the sample chamber, first at Step S201, as shown in FIG. 16A, the stage 9 is moved to a place where a defective part 70 of the sample 35 detected by another optical inspection device (not shown) becomes located near the center of the visual field of an observational electron beam of the electron beam column 4 (or the pollution measuring beam column 6A or 6B) by a coordinate conversion by use of a coordinate linkage. The positioning of the sample 35 is eventually performed while observing the defective part 70 in a SEM image by an electron beam from the electron beam column 4 (or the pollution measuring beam column 6A or 6B). However, the defective part 70 is first grasped by a low-magnification SEM image, because the defective part 70 may sometimes deviate from the visual field in a high-magnification SEM image if errors of the positioning accuracy by the coordinate linkage are as large as several micrometers.

When the sequence of operations has proceeded to Step S202, a mark 71 that is larger than the defective part 70 is formed by electron beam deposition by use of the electron beam gas gun 5 and the electron beam column 4 (or 6A, 6B) in a place at a prescribed distance from the defective part 70 (for example, on the order of several micrometers) (see FIG. 16B). By forming this mark 71, it becomes possible to efficiently search for the defective part 70 in cutting out the defective part 70 by the ion beam 11. The mark 71 is formed in several minutes, for example, if the conditions are such that, for example, the electron beam current is several hundreds of picoamperes, that the area of irradiation with an electron beam is several micrometers square, and that the raw material gas is TEOS.

At Step S203, so that the defective part 70 and the mark 71 are located near the beam axis of the ion beam 11 of the ion beam column 1, the position of the stage 9 is adjusted while observing a SIM image by an observational ion beam from the ion beam column 1 on the SIM/SEM image display section 64 of FIG. 10.

At Step S204, the microsample 43 is cut out of the sample 35 by the ion beam 11 from the ion beam column 1. On this occasion, the sample 35 is irradiated with the ion beam 11 shaped to have a cross section in the shape of U, for example, first by the mask hole 40A of FIG. 4 so as to surround the defective part 70 and the mark 71.

When the sequence of operations has proceeded to Step S205, the leading end of the probe 16 is brought into contact with the microsample 43 by manipulating the microsampling unit 3 and an oxide silicon film is formed by ion beam assist deposition, whereby the probe 16 and the microsample 43 are bonded together. Subsequently, the sample 35 is irradiated with the ion beam 11 having a rectangular section shaped by the mask hole 40B of FIG. 4 so as to surround the sample 35 and the mark 71 between the ends of the U-shaped processed hole that has been formed beforehand, and the microsample 43 having the shape of a triangular prism that includes the sample 35 and the mark 71 is cut off. And the microsample 43 is picked out of the sample 35 by manipulating the probe 16 (see FIG. 16C). Incidentally, the order of the irradiation with the U-shaped ion beam and the rectangular ion beam may be reversed.

At Step S206, the picked-out microsample 43 is mounted on the mesh 44 of the cartridge unit 41 by manipulating the probe 16 and the stage 9, the microsample 43 is bonded to the mesh 44, and the probe 16 and the microsample 43 are separated. And by driving the motor 47, the cartridge 42 is rotated so that the travel axis (incident direction) of the ion beam 11 of the ion beam column 1 and the depth direction of the microsample 43 coincide with each other (see FIGS. 7A and 7B), and at the same time, the stage 9 is moved so that the place of the microsample 43 to be processed is located in the aiming position of the ion beam 11.

At Step S207, the microsample 43 is irradiated with the slit-like ion beam 11 shaped by the mask hole 40C of FIG. 4 and the microsample 43 is thin-film processed (see FIGS. 7C and 7D). The ion beam 11 has an ion beam width, for example, on the order of several hundreds of nanometers, and the ion generation source and processing optical conditions are examined beforehand to ensure a current value sufficient for processing.

Subsequently, the sequence of operations is caused to proceed to Step S208, gas assist deposition by TEOS using the ion beam column 1 is performed in order to bury a hole portion 72 of the sample 35 (see FIG. 16C) after the picking-out of the microsample 43. In hole-burying, the hole is buried with an ion beam having a sectional shape fitted to the hole shape or an ion beam in the scanning region by supplying TEOS. It is also possible to use carbon-based gases, such as phenanthrene, in addition to TEOS. As another method, it is also possible to prepare a member having a shape fitted to the hole portion 72 after the picking-out of the microsample 43 and to form a deposition film on the surface by putting the member into the hole portion 72. Laser light may also be used in place of the ion beam.

At Step S209, after the retracting of the stage 9 into the atmosphere chamber, the cartridge 42 is detached from the cartridge unit 41 and the microsample 43 thin-film processed at Step S207, along with the cartridge 42, is taken out to outside this charged particle beam processing apparatus.

The operations described above are all operations performed using the first unit 100 or 100A.

When the microsample 43 has been taken out as described at Step S209, the sequence of operations proceeds to Step S210, where the cartridge 42 is attached to a dedicated cartridge holder prepared separately for making analyses by use of another observation device having higher resolution, such as a STEM and a TEM, and the microsample 43 is observed and analyzed under a STEM or a TEM (see FIG. 7E). As a result of this, the procedure for picking out the microsample and the procedure for observing the microsample are finished.

Because a section processed by an ion beam is relatively flat, it is difficult to sufficiently obtain the edge effect in which many secondary elements from edge portions are generated, and an object may sometimes be difficult to observe in an obtained SEM image. For this reason, if gas assist etching, which involves irradiating the sample 35, the microsample 43 and the like with beams of several picoamperes while irradiating the sample 35, the microsample 43 and the like with a gas containing fluorine, is performed in processing the sample 35, the microsample 43 and the like by the ion beam 11, a difference in the sputter rate ascribed to materials constituting the section occurs and unevenness on the order of several nanometers is formed on the surface of the section, with the result that a SEM observation becomes easy.

Incidentally, in the procedure of FIG. 15, the description was given of a case where the microsample 43 is thin-film processed and observed by other devices, such as a STEM and a TEM, as an example. However, when observations are possible with the resolution of a SEM, the microsample 43 may also be observed by using the electron beam columns 4, 6A, 6B as described above. It is also conceivable that the electron beam columns 4, 6A, 6B are TEMs or STEMs. In these cases, it is possible to perform operations from pollution measurement to the processing and observation of the sample within this charged particle beam processing apparatus without taking out the cartridge 42 to outside the apparatus.

<Operation Effect>

In this apparatus, even when a processing ion beam of a nonmetallic ion species is used, it is impossible to deny the possibility of unexpected occurrence of metal pollution when the power supply control system stops in association with a short-circuit discharge immediately after the maintenance of the ion generation source and a power failure. If the operation of the power supply is unstable, the behavior of the applied voltage of the condenser lens within the ion beam column, of the applied voltage and acceleration voltage for processing beam extraction, of the applied voltage of the electrode of the mass separator, and of the applied voltage of the electrode of the deflector and the like does not become stable. Therefore, the ion beam deviates from a target and is applied to a metal portion, and a metal ion beam to be removed is not removed and reaches the sample, with the result that metal pollution occurs.

Figure 17:
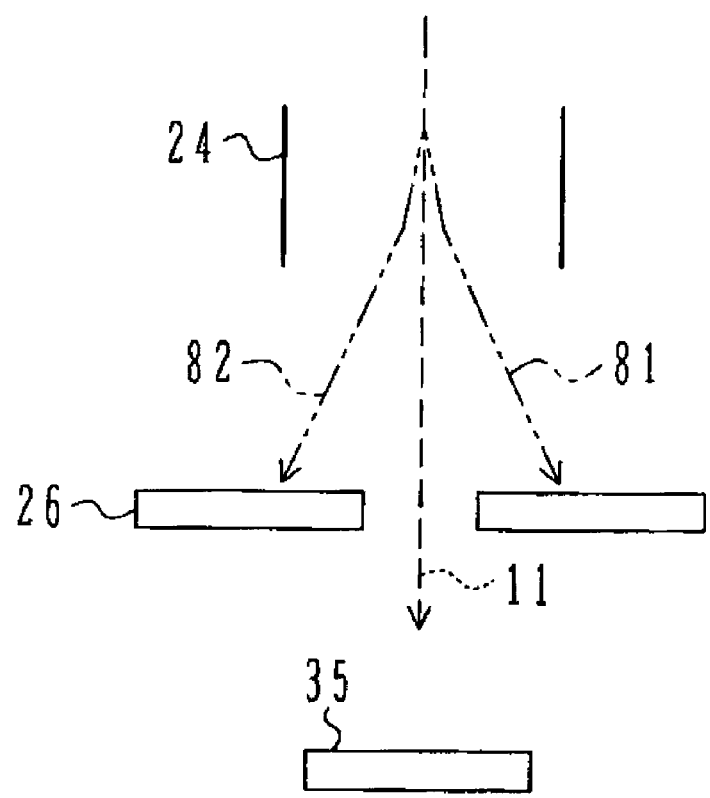
FIG. 17 is a diagram that explains the process of occurrence of pollution by taking, as an example, a case where metal pollution occurs when mistakes are made in setting the applied voltage of a mass separator, the current density value of a magnetic field generating coil and the applied voltage value of a deflector.

Such abnormal operations are not only caused by a short-circuit discharge and a power failure but also can occur when the operator makes mistakes in setting the beam conditions when changing the processing beam species and the beam irradiation conditions. FIG. 17 explains an example of a case where metal pollution occurs when mistakes are made in setting the applied voltage of a mass separator, the current density value of a magnetic field generating coil and the applied voltage value of a deflector.

In FIG. 17, the voltage is applied to the mass separator 24 in the direction in which the electric field and the magnetic field are orthogonal to each other. For example, if the mass separator 24 uses an E×B mass spectrometer, it is necessary only that the relationship between the intensity E of an electric field to be applied to the E×B mass spectrometer and the magnetic flux density B hold as given by the following equation in order to ensure that the ion beam 11 used in processing in all ion beams that became incident on the mass separator 24 is caused to pass without being deflected in the E×B mass spectrometer:

$$E = B \times vl$$

Where vl is the incident ray speed of an ion beam.

On the other hand, the ion beams 81, 82 of an ion species having a mass different from that of the ion beam 11 are deflected by the mass separator 24, collides against the aperture 26, and is shut off by the aperture 26.

However, if mistakes are made in the setting of E and B due to human errors and the like, the ion beams 81, 82 and the like that should be removed pass through the aperture 26 and may be sometimes applied to the sample 35. If the ion beams 81, 82 are metallic ion beams, then metal pollution occurs in the sample 35. The occurrence of metal pollution cannot be visually recognized. Therefore, if a semiconductor process continues to operate without the recognition of the occurrence of metal pollution, pollution of samples continues also at succeeding steps and the manufacturing line of the succeeding steps becomes contaminated. The later the occurrence of pollution is recognized, the more labor and time will be required in discarding samples polluted with metals as well as in restoring the manufacturing line and the more enormous the wasted cost will be.

In contrast to this, according to this embodiment, as described above, it is possible to measure the level of contamination before the sample processing after the startup of the apparatus following the occurrence of a discharge within the apparatus or a power failure and following unsteady operations, such as beam irradiation conditions, and hence it is possible to quickly detect the occurrence of metal pollution before sample processing. Therefore, because pollution control measures can be promptly taken by suppressing the formation of polluted samples, it is possible to reduce the amount of discarded samples (wafers) and to suppress the spread of metal pollution to the semiconductor manufacturing process to a minimum degree, with the result that it is possible to improve yields. Also, the operator can quickly get to know the occurrence of pollution by the warning and display of the occurrence of metal pollution and hence the operator can carry out pollution control measures by promptly suspending treatment.

Furthermore, in the case of this embodiment, as described above, the ion beam column 1 that processes the sample 35, the pollution measuring beam column 6A(or 6B) that measures the level of metal pollution by the ion beam 11 for sample processing, and the detector 7 are provided within the same vacuum vessel 10, and the same target (the sample 54 in the case of this embodiment) can be irradiated with the processing ion beam 11 and the pollution measuring beam 13 without being removed from one sample holder 8.

If the ion beam column 1 and the pollution measuring beam column 6A (or 6B) are not connected to the same vacuum vessel 10 and pollution measurement is made by using a device provided separately from the FIB device, it is necessary that a sample prepared for pollution measurement be irradiated with the ion beam 11 of the ion beam column 1 thereby to prepare a sample and that pollution inspection be performed by setting the sample again in a pollution measuring device separately provided.

In contrast to this, in the case of this embodiment, it is possible to measure the pollution of a target irradiated with the ion beam 11 without taking the target to outside the apparatus. Therefore, it is possible to substantially shorten the time required by pollution measurement compared to the case where measurement is made by use of other devices. That is, it is possible to reduce the down time of the charged electron beam processing apparatus to a minimum degree and to substantially improve the throughput. Also, it is possible to make the apparatus inexpensive by connecting the ion beam column for sample processing and the pollution measuring beam column 6A (or 6B) to the same vacuum vessel 10 in an integrated manner.

Incidentally, in the above-described embodiment, the beam axes of the ion beam 11 from the ion beam column 1 and of the pollution measuring beam 13 from the pollution measuring beam column 6A (or 6B) do not intersect each other, and the position irradiated with the ion beam 11 and the position irradiated with the pollution measuring beam 13 are spaced from each other. For this reason, the construction is such that in making pollution measurement, the position of the sample holder 8 is adjusted by driving the stage 9, whereby the ion beam irradiation traces are caused to coincide with the aiming position of the pollution measuring beam 13. However, the present invention is not limited to this construction so long as an ion beam abnormality is detected before sample processing. It is also conceivable that as in the positional relationship between the electron beam column 4 and the ion beam column 1 in FIG. 1, for example, an electron beam column for pollution measurement and a characteristic X-ray detector, which have the same beam aiming position as the ion beam column 1 are disposed on the first unit 100 side.

The above description was given by taking, as an example, the case where the pollution monitoring jig 53 is provided and measurements are made to ascertain whether the ion beam 11 is contaminated by shooting the pollution monitoring jig 53 with the ion beam 11 before the processing of the sample 35. However, as a matter of course, the present invention can be applied also to the pollution measurement of the sample 35. The pollution monitoring jig 53 may be omitted when the prior inspection of the ion beam is not a precondition.

According to the present invention, it is possible to improve yields by suppressing the spread of metal pollution to a semiconductor manufacturing process to a minimum extent.

What is claimed is:

1. A charged particle beam processing apparatus, comprising:
    a sample holder that holds a sample;
    a stage that moves the sample holder;
    a vacuum vessel that encloses the sample holder and the stage;
    an ion generation source;
    an ion beam column that is connected to the vacuum vessel, takes out an ion beam of a nonmetallic ion species from the ion generation source and irradiates the sample with the ion beam;
    a microsampling unit having a probe that picks out a micro test piece cut out of the sample by an ion beam from the ion beam column;
    a gas gun that discharges a gas that bonds the micro test piece and the probe together;
    a pollution measuring beam column that is connected to the same vacuum vessel to which the ion beam column is connected and irradiates ion beam irradiation traces formed by the ion beam column with a pollution measuring beam, which is an electron beam or an X-ray beam; and
    a detector that detects a characteristic X-ray that is emitted from the ion beam irradiation traces formed by the ion beam column upon irradiation with a pollution measuring beam from the pollution measuring beam column,
    wherein an aiming position of an ion beam from the ion beam column and an aiming position of a pollution measuring beam from the pollution measuring beam column are spaced from each other and, in a state where the ion beam irradiation traces formed by the ion beam column are irradiated with a pollution measuring beam, the position of the sample holder is adjustable by driving the stage, whereby the ion beam irradiation traces are caused to coincide with the aiming position of a pollution measuring beam.

2. The charged particle beam processing apparatus according to claim 1, wherein the nonmetallic ion species is an inactive gas species, oxygen or nitrogen.

3. The charged particle beam processing apparatus according to claim 1, wherein a pollution monitoring jig having a pollution measuring sample for irradiating a portion of the sample holder other than a region holding a sample with an ion beam is detachably provided and after the pollution measuring sample is irradiated with an ion beam before sample processing, an element of the ion beam irradiation traces is measured by irradiating the pollution measuring sample with a pollution measuring beam, whereby whether a metal is contained in the ion beam is detected beforehand.

4. The charged particle beam processing apparatus according to claim 1, wherein the charged particle beam processing apparatus incorporates a program for causing a control unit to execute processing that involves measuring the content of a metal on the basis of the characteristic X-ray detected by the detector and passing judgment on the occurrence or nonoccurrence of pollution by comparing the measured metal content with a preset pollution judgment value.

5. The charged particle beam processing apparatus according to claim 4, wherein the charged particle beam processing apparatus further comprises a console that is provided with a pollution monitoring button that gives instructions to start the execution of the program and warning means that informs an operator of the occurrence of pollution when the pollution has been recognized as a result of the pollution measurement.

6. The charged particle beam processing apparatus according to claim 5, wherein the console has display means for pollution control measures that display details of pollution control measures on the basis of a metallic ion species whose value exceeds the pollution judgment value when the pollution has been recognized.

7. The charged particle beam processing apparatus according to claim 1, wherein the pollution measuring beam column also serves as an observational electron beam column.

8. The charged particle beam processing apparatus according to claim 1, wherein a housing of the ion beam column is formed to be bent so that the output axis of an ion beam from the ion generation source is inclined with respect to the axis of incidence of an ion beam incident on a sample.

9. The charged particle beam processing apparatus according to claim 1, wherein the charged particle beam processing apparatus further comprises an observational electron beam column constituted by any one of an STEM, a TEM and an SEM.

10. The charged particle beam processing apparatus according to claim 1, wherein the sample holder is provided with a mesh on which a microsample picked out of a sample by the microsampling unit is mounted and the microsample mounted on the mesh is thin-film processed within the vacuum vessel by an ion beam from the ion beam column.

11. A charged particle beam processing apparatus, comprising:
    a pollution monitoring jig having a pollution measuring sample to which an ion beam is to be irradiated;
    a vacuum vessel that encloses the pollution monitoring jig;
    an ion generation source;
    an ion beam column that is connected to the vacuum vessel, takes out an ion beam of a nonmetallic ion species from the ion generation source and irradiates the pollution measuring sample with the ion beam;
    a pollution measuring beam column that is connected to the same vacuum vessel to which the ion beam column is connected and irradiates ion beam irradiation traces in the pollution measuring sample formed by the ion beam column with a pollution measuring beam, which is an electron beam or an X-ray beam; and
    a detector that detects a characteristic X-ray emitted from the ion beam irradiation traces in the pollution measuring sample formed by the ion beam column upon irradiation with a pollution measuring beam from the pollution measuring beam column,
    wherein an aiming position of an ion beam from the ion beam column and an aiming position of a pollution measuring beam from the pollution measuring beam column are spaced from each other and, in a state where the ion beam irradiation traces in the pollution measuring sample are irradiated with a pollution measuring beam, the position of the pollution measuring sample is adjustable by driving the stage, whereby the ion beam irradiation traces are caused to coincide with the aiming position of a pollution measuring beam.

12. The charged particle beam processing apparatus according to claim 11, wherein the nonmetallic ion species is an inactive gas species, oxygen or nitrogen.

13. The charged particle beam processing apparatus according to claim 11, wherein the charged particle beam processing apparatus incorporates a program for causing a control unit to execute processing that involves measuring the content of a metal on the basis of the characteristic X-ray detected by the detector and passing judgment on the occurrence or nonoccurrence of pollution by comparing the measured metal content with a preset pollution judgment value.

14. The charged particle beam processing apparatus according to claim 13, wherein the charged particle beam processing apparatus further comprises a console that is provided with a pollution monitoring button that gives instructions to start the execution of the program and warning means that informs an operator of the occurrence of pollution when the pollution has been recognized as a result of the pollution measurement.

15. The charged particle beam processing apparatus according to claim 14, wherein the console has display means for pollution control measures that display details of pollution control measures on the basis of a metallic ion species whose value exceeds the pollution judgment value when the pollution has been recognized.

16. A charged particle beam processing apparatus, comprising:
a sample holder that holds a sample;
a stage that moves the sample holder;
a vacuum vessel that encloses the sample holder and the stage;
an ion generation source;
an ion beam column that is connected to the vacuum vessel, takes out an ion beam of a nonmetallic ion species from the ion generation source and irradiates the sample with the ion beam;
a microsampling unit having a probe that picks out a micro test piece cut out of the sample by an ion beam from the ion beam column;
a gas gun that discharges a gas that bonds the micro test piece and the probe together;
a pollution measuring beam column that is connected to the same vacuum vessel to which the ion beam column is connected and irradiates ion beam irradiation traces formed by the ion beam column with a pollution measuring beam, which is an electron beam or an X-ray beam;
a detector that detects a characteristic X-ray that is emitted from the ion beam irradiation traces formed by the ion beam column upon irradiation with a pollution measuring beam from the pollution measuring beam column; and
a pollution monitoring jig having a pollution measuring sample to which an ion beam is to be irradiated, the pollution measuring sample being provided in a portion of the sample holder other than a region holding a sample,
wherein after the pollution measuring sample is irradiated with an ion beam before sample processing, an element of the ion beam irradiation traces in the pollution measuring sample is measured by irradiating the pollution measuring sample with a pollution measuring beam, whereby whether a metal is contained in the ion beam is detected beforehand, and
wherein an aiming position of an ion beam from the ion beam column and an aiming position of a pollution measuring beam from the pollution measuring beam column are spaced from each other and, in a state where the ion beam irradiation traces in the pollution measuring sample are irradiated with a pollution measuring beam, the position of the pollution measuring sample is adjustable by driving the stage, whereby the ion beam irradiation traces are caused to coincide with the aiming position of a pollution measuring beam.

17. The charged particle beam processing apparatus according to claim 16, wherein the nonmetallic ion species is an inactive gas species, oxygen or nitrogen.

18. The charged particle beam processing apparatus according to claim 16, wherein the charged particle beam processing apparatus incorporates a program for causing a control unit to execute processing that involves measuring the content of a metal on the basis of the characteristic X-ray detected by the detector and passing judgment on the occurrence or nonoccurrence of pollution by comparing the measured metal content with a preset pollution judgment value.

19. The charged particle beam processing apparatus according to claim 16, wherein the charged particle beam processing apparatus further comprises a console that is provided with a pollution monitoring button that gives instructions to start the execution of the program, warning means that informs an operator of the occurrence of pollution when the pollution has been recognized as a result of the pollution measurement and display means for pollution control measures that display details of pollution control measures on the basis of a metallic ion species whose value exceeds the pollution judgment value when the pollution has been recognized.

20. A charged particle beam processing apparatus, comprising: a sample holder that holds a sample; a stage that moves the sample holder; a vacuum vessel that encloses the sample holder and the stage; an ion generation source; an ion beam column that is connected to the vacuum vessel, takes out an ion beam of a nonmetallic ion species from the ion generation source and irradiates the sample with the ion beam; a microsampling unit having a probe that picks out a micro test piece cut out of the sample by an ion beam from the ion beam column; a gas gun that discharges a gas that bonds the micro test piece and the probe together; an observational electron beam column constituted by any one of an STEM a TEM and an SEM; a pollution measuring beam column that is connected to the same vacuum vessel to which the ion beam column is connected and irradiates ion beam irradiation traces formed by the ion beam column with a pollution measuring beam which is an electron beam or an X-ray beam; and a detector that detects a characteristic X-ray that is emitted from the ion beam irradiation traces formed by the ion beam column upon irradiation with a pollution measuring beam from the pollution measuring beam column.

21. A charged particle beam processing apparatus, comprising: a pollution monitoring jig having a pollution measuring sample to which an ion beam is to be irradiated; a vacuum vessel that encloses the pollution monitoring jig; an ion beam column that is connected to the vacuum vessel, takes out an ion beam of a nonmetallic ion species from the ion generation source and irradiates the pollution measuring sample with the ion beam; an observational electron beam column constituted by any one of an STEM, a TEM and an SEM; a pollution measuring beam column that is connected to the same vacuum vessel to which the ion beam column is connected and irradiates ion beam irradiation traces in the pollution measuring sample formed by the ion beam column with a pollution measuring beam, which is an electron beam or an X-ray beam; and a detector that detects a characteristic X-ray emitted from the ion beam irradiation traces in the pollution measuring sample formed by the ion beam column upon irradiation with a pollution measuring beam from the pollution measuring beam column.

22. A charged particle beam processing apparatus, comprising: a sample holder that holds a sample; a stage that moves the sample holder; a vacuum vessel that encloses the sample holder and the stage; an ion generation source; an ion beam column that is connected to the vacuum vessel, takes out an ion beam of a nonmetallic ion species from the ion generation source and irradiates the sample with the ion beam; a microsampling unit having a probe that picks out a micro test piece cut out a sample by an ion beam from the ion beam column a gas gun that discharges a gas that bonds the micro test piece and the probe together; a pollution measuring beam column that is connected to the same vacuum vessel to which the ion beam column is, connected and irradiates ion beam irradiation traces formed by the ion beam column with a pollution measuring beam, which is, an electron beam or an X-ray beam; an observational electron beam column constituted by any one of an STEM, a TEM and an SEM; a detector that detects a characteristic X-ray that is emitted from the ion beam irradiation traces formed by the ion beam column upon irradiation with a pollution measuring beam from the pollution measuring beam column; and a pollution monitoring jig having a pollution measuring sample to which an ion beam is to be irradiated, the pollution measuring sample being provided in a portion of the sample holder other than a region holding a sample; wherein after the pollution measuring sample is irradiated with an ion beam before sample processing, an element of the ion beam irradiation traces in the pollution measuring sample is measured by irradiating the pollution measuring sample with a pollution measuring beam, whereby whether a metal is contained in the ion beam is detected beforehand.

* * * * *